(12) United States Patent
Mizokami

(10) Patent No.: US 10,063,205 B2
(45) Date of Patent: Aug. 28, 2018

(54) SEMICONDUCTOR DEVICE

(71) Applicant: Renesas Electronics Corporation, Tokyo (JP)

(72) Inventor: Masakazu Mizokami, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/706,438

(22) Filed: Sep. 15, 2017

(65) Prior Publication Data

US 2018/0115291 A1 Apr. 26, 2018

(30) Foreign Application Priority Data

Oct. 20, 2016 (JP) ................... 2016-205906

(51) Int. Cl.

| | |
|---|---|
| *H04K 1/02* | (2006.01) |
| *H04L 25/03* | (2006.01) |
| *H04L 25/49* | (2006.01) |
| *H03G 3/30* | (2006.01) |
| *G01R 25/04* | (2006.01) |
| *H03F 1/02* | (2006.01) |
| *H03F 3/217* | (2006.01) |
| *H03F 3/24* | (2006.01) |

(52) U.S. Cl.
CPC ........... *H03G 3/3042* (2013.01); *G01R 25/04* (2013.01); *H03F 1/0227* (2013.01); *H03F 1/0233* (2013.01); *H03F 3/217* (2013.01); *H03F 3/245* (2013.01)

(58) Field of Classification Search
CPC .... H03G 3/3042; G01R 25/04; H03F 1/0227; H03F 3/217; H03F 1/0233; H03F 3/245; H03F 3/19; H03F 1/3211

USPC .................................................. 375/296, 297
See application file for complete search history.

(56) References Cited

U.S. PATENT DOCUMENTS

| | | | | |
|---|---|---|---|---|
| 3,794,921 A | * | 2/1974 | Unkauf | H04B 7/005 327/100 |
| 5,789,950 A | * | 8/1998 | Nakagawa | G06J 1/00 327/105 |
| 7,276,962 B1 | * | 10/2007 | Tomasi | H03F 1/3211 330/254 |
| 2007/0042740 A1 | * | 2/2007 | Woo-nyun | H03D 7/14 455/302 |

(Continued)

FOREIGN PATENT DOCUMENTS

JP 2015-115946 A 6/2015

*Primary Examiner* — Phuong Phu
(74) *Attorney, Agent, or Firm* — McGinn I.P Law Group, PLLC.

(57) ABSTRACT

In a related-art semiconductor device, there is a problem that a second-order harmonic distortion originating in a power amplifier driven by a rectangular-wave signal cannot be effectively suppressed. According to an embodiment, a semiconductor device generates a transmission signal RF_OUT for driving an antenna by receiving first transmission pulses INd_P and second transmission pulses INd_N having a duty ratio lower than 50%, adjusting a phase difference between the first and second transmission pulses INd_P and INd_N to a predefined phase difference, and supplying the phase-difference-adjusted first and second transmission pulses INd_P and INd_N to a power amplifier 54.

9 Claims, 16 Drawing Sheets

(56) References Cited

U.S. PATENT DOCUMENTS

2015/0162878 A1    6/2015  Ba
2018/0026595 A1\*  1/2018  Kao ......................... H03F 3/19

\* cited by examiner

TRUTH TABLE OF PHASE DIFFERENCE DETECTOR

| INc_P | INc_N | OUT(t) |
|---|---|---|
| 0 | 0 | OUT(t-1) |
| 0 | 1 | 0 |
| 1 | 0 | 1 |
| 1 | 1 | 0 |

SEMICONDUCTOR DEVICE

CROSS-REFERENCE TO RELATED APPLICATIONS

This application is based upon and claims the benefit of priority from Japanese patent application No. 2016-205906, filed on Oct. 20, 2016, the disclosure of which is incorporated herein in its entirety by reference.

BACKGROUND

The present disclosure relates to a semiconductor device. For example, the present disclosure relates to a semiconductor device including a power amplifier that generates a transmission signal for driving an antenna based on two-phase pulses.

In recent years, an IoT (Internet of Things) concept in which products that were not connected to a network in the past are connected to a network all the time and controlled through the network has been proposed. In this IoT concept, it has been considered that, for example, a smart meter, a gas meter, or an infrastructure management product such as a product for building management is enabled to be connected to a network. In this IoT concept, radio signals whose carrier-wave frequency is in a sub-giga Hz band, i.e., is no higher than 1 GHz are used in some cases. Compared to radio signals in a 2.4 GHz band, radio signals in the sub-giga Hz band are excellent in terms of a communication range, a diffracting property of radio signals, or power consumption, and hence are suitable for use as communication signals for products that are assumed to be used in the IoT concept.

Note that in radio communication, a transmission signal for driving an antenna is generated by a power amplifier. This power amplifier is required to have high power efficiency in order to reduce the power consumption. However, the power efficiency has a tradeoff relation with a harmonic distortion characteristic. Therefore, in order to meet communication standards, the harmonic distortion characteristic is satisfied at the sacrifice of the power efficiency. To alleviate this tradeoff relation, Japanese Unexamined Patent Application Publication No. 2015-115946 discloses an example of a technique for reducing a harmonic distortion.

A harmonic cancellation circuit for power amplifier disclosed in Japanese Unexamined Patent Application Publication No. 2015-115946 is a circuit including: an input port for applying a sine wave input signal; first buffer means for converting the sine wave input signal into a rectangular-wave signal; and an output port for outputting the rectangular-wave signal to a power amplifier, in which: the rectangular-wave signal has a DC level defined by an adjustable threshold voltage level; a feedback loop includes: low-pass filter means provided for filtering the rectangular-wave signal; and comparison means provided for comparing a DC level of a filtered signal received from the low-pass filter means with a predefined reference level; the reference level is selected for cancelling out a given harmonic component; and the comparison means is configured to output a correction signal for adjusting the threshold voltage level of the first buffer means to the first buffer means.

That is, in the harmonic cancellation circuit for power amplifier disclosed in Japanese Unexamined Patent Application Publication No. 2015-115946, a harmonic distortion caused in a transmission signal is suppressed by detecting the DC level of the transmission rectangular-wave signal and comparing the detected DC level of the transmission rectangular-wave signal with the reference voltage so that a desired duty ratio is obtained.

SUMMARY

However, the present inventors have found the following problem. In the case of a power amplifier driven by a two-phase rectangular-wave signal, there is a problem that even when a difference between duty ratios of two rectangular-wave signals is eliminated by using the technique disclosed in Japanese Unexamined Patent Application Publication No. 2015-115946, a second-order harmonic distortion characteristic caused in the transmission signal cannot be improved. This deterioration of the second-order harmonic distortion characteristic is caused because a second-order harmonic component that is caused when a phase difference between the two-phase signals is not 180° remains.

Other objects and novel features will be more apparent from the following description in the specification and the accompanying drawings.

According to one embodiment, a semiconductor device is configured to generate a transmission signal for driving an antenna by receiving first transmission pulses and second transmission pulses having a duty ratio lower than 50%, adjusting a phase difference between the first and second transmission pulses to a predefined phase difference, and supplying the phase-difference-adjusted first and second transmission pulses to a power amplifier.

According to the semiconductor device in accordance with an embodiment, it is possible to improve efficiency of a power amplifier by suppressing a second-order harmonic of the power amplifier.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

For clarifying the explanation, the following descriptions and the drawings may be partially omitted and simplified as appropriate. Further, the same symbols are assigned to the same components throughout the drawings and duplicated explanations are omitted as required.

First Embodiment

Firstly, a semiconductor device according to a first embodiment is a radio chip that generates reception data from a reception signal input through an antenna in a communication apparatus and also generates a transmission signal for driving the antenna based on transmission data. Note that the semiconductor device according to the first embodiment may take charge of one of a receiving function for generating reception data from a reception signal and a transmission function of generating a transmission signal from transmission data in the radio chip, or may take charge of a part of the function.

Figure 1:
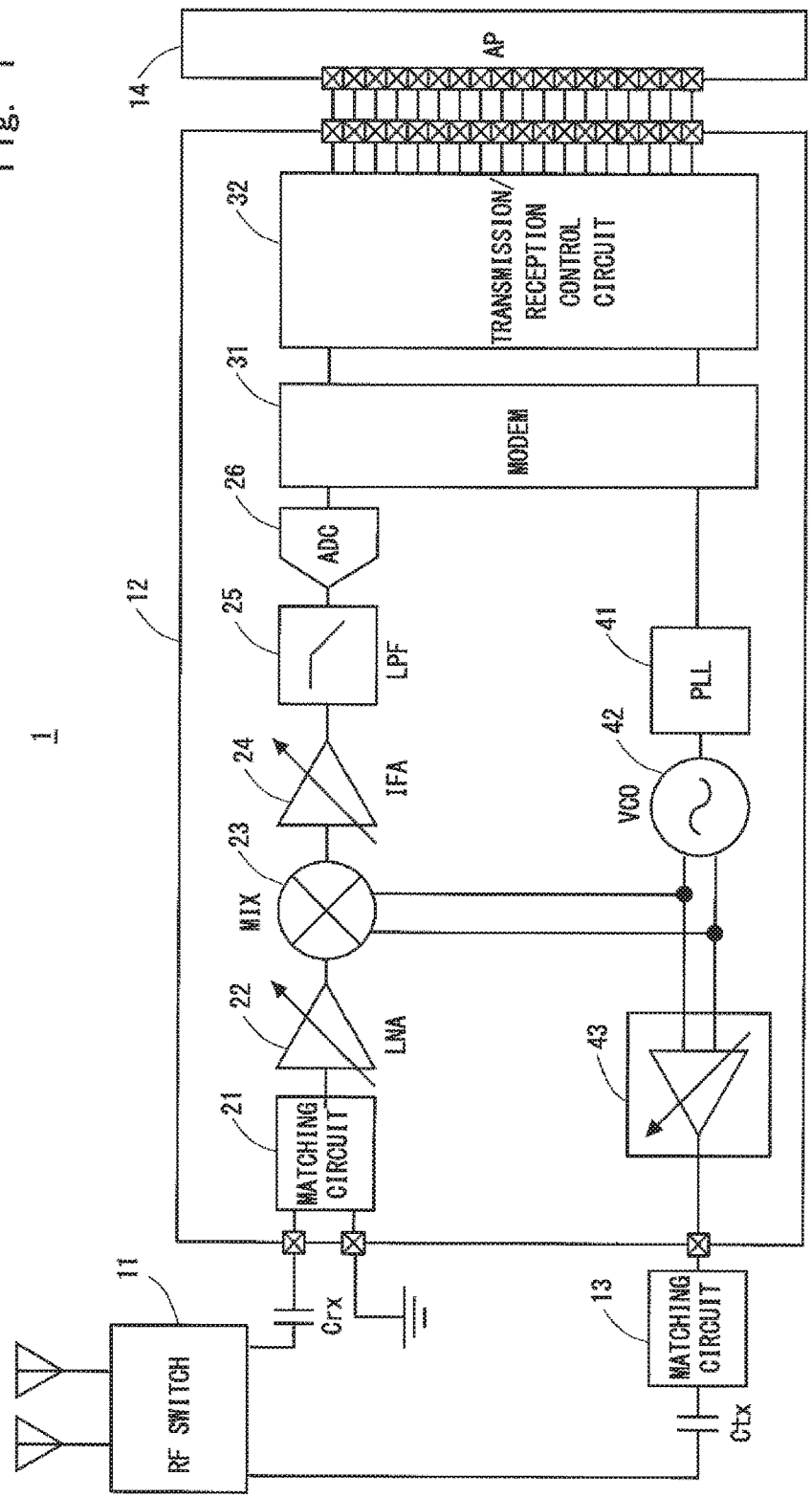
FIG. 1 is a block diagram of a radio apparatus according to a first embodiment.

Accordingly, a radio apparatus including a semiconductor device according to the first embodiment is explained hereinafter. FIG. 1 shows a block diagram of a radio apparatus 1 according to the first embodiment. Note that the configuration of the radio apparatus shown in FIG. 1 is merely an example of a configuration of a radio apparatus. That is, the circuit for implementing a radio apparatus is not limited to the example shown in FIG. 1. As shown in FIG. 1, the radio apparatus 1 according to the first embodiment includes an antenna, an RF switch 11, a matching circuit 13, an application processor 14, and capacitors Crx and Ctx.

The RF switch 11 transmits a reception signal received through the antenna to a reception process system block in a radio chip 12 and also transmits a transmission signal output from a transmission process system block in the radio chip 12 to the antenna. Then, in the radio apparatus 1 according to the first embodiment, the transmission signal is transmitted from the RF switch 11 to the radio chip 12 through the capacitor Crx. Further, in the radio apparatus 1 according to the first embodiment, the transmission signal output from the radio chip 12 is transmitted to the RF switch 11 through the matching circuit 13 and the capacitor Ctx. The matching circuit 13 is provided to obtain impedance matching between the antenna and an output of the radio chip 12. Although the matching circuit 13 is disposed as an external component disposed outside the radio chip 12 in FIG. 1, it may instead be disposed inside the radio chip 12.

The radio chip 12 performs a conversion process between a data signal handled in the application processor 14 and a transmission/reception signal transmitted/received through the antenna. The application processor 14 performs signal processing related to various functions implemented in the radio apparatus 1. The application processor 14 is, for example, a CPU (Central Processing Unit) equipped with an arithmetic unit capable of executing a program, an MCU (Micro Controller Unit), or the like. The radio apparatus 1 according to the first embodiment transmits transmission data that is generated through processing performed in the application processor 14 to an apparatus on the other end of the communication (hereinafter simply called "the other apparatus") through the radio chip 12 and the antenna. Further, the radio apparatus 1 according to the first embodiment converts transmission data transmitted from the other apparatus in the form of a radio signal into reception data by using the radio chip 12, and performs processing based on the reception data in the application processor 14.

Note that the radio chip 12 includes a matching circuit 21, a low-noise amplifier 22, a mixer 23, an IF amplifier 24, a low-pass filter 25, an analog/digital conversion circuit 26, a modem 31, a transmission/reception control circuit 32, a PLL circuit 41, a voltage control oscillation circuit 42, and a power amplifier unit 43.

The matching circuit 21 is a circuit for obtaining impedance matching between the antenna and an input of the radio chip 12. The low-noise amplifier 22 is a variable-gain amplifier, and amplifies a reception signal received through the matching circuit 21 and outputs the amplified reception signal to the mixer 23. The mixer 23 demodulates a transmission signal in a radio frequency band output from the low-noise amplifier 22 into a baseband signal in a baseband frequency band. The mixer 23 performs the demodulation process from the transmission signal into the baseband signal by using a local oscillation signal output by the voltage control oscillation circuit 42. The IF amplifier 24 is a variable-gain amplifier and amplifies the baseband signal output by the mixer 23. The low-pass filter 25 removes noises in a range near the baseband frequency band in the baseband signal output by the IF amplifier 24. The analog/digital conversion circuit 26 converts the baseband signal output by the low-pass filter 25 into digital values. That is, in the radio chip 12, the matching circuit 21, the low-noise amplifier 22, the mixer 23, the IF amplifier 24, the low-pass filter 25, the analog/digital conversion circuit 26, the PLL circuit 41, and the voltage control oscillation circuit 42 form a reception process system circuit.

The modem 31 performs a decoding process and the like for the digitized reception signal output from the analog/digital conversion circuit 26 and thereby generates reception data. The reception data generated by the modem 31 is supplied to the application processor 14 through the transmission/reception control circuit 32. Further, the modem 31 performs an encoding process and the like for transmission data supplied from the application processor 14 through the transmission/reception control circuit 32 and outputs the processed transmission data to the PLL circuit 41.

The transmission/reception control circuit 32 sets an operating mode of a transmitting process and a receiving process of the radio chip 12. For example, in radio communication, the frequency of a carrier wave, a modulation method, and so on are changed according to the communication method. Therefore, the transmission/reception control circuit 32 changes a setting of each block according to the used communication method.

The PLL circuit 41 outputs a pulse signal having a frequency that is determined according to transmission data output by the modem 31. The voltage control oscillation circuit 42 superimposes a local oscillation signal that serves as a carrier wave on the pulse signal output by the PLL circuit 41 and outputs the resultant signal. That is, the PLL circuit 41 and the voltage control oscillation circuit 42 modulate the frequency of the transmission data in the baseband frequency band to a frequency in a radio frequency band. The voltage control oscillation circuit 42 outputs two pulse signals each of which has a rectangular waveform and whose phase difference is ideally 180°. The power amplifier unit 43 is driven by the pulse signals output by the voltage control oscillation circuit 42 and outputs a transmission signal RF_OUT corresponding to the transmission data. This transmission signal RF_OUT is transmitted to the antenna through the matching circuit 13 and the capacitor Crx.

Note that the two pulse signals output by the voltage control oscillation circuit 42 are referred to as a positive transmission pulse signal and a negative transmission pulse signal, respectively, in the following explanation.

Figure 2:
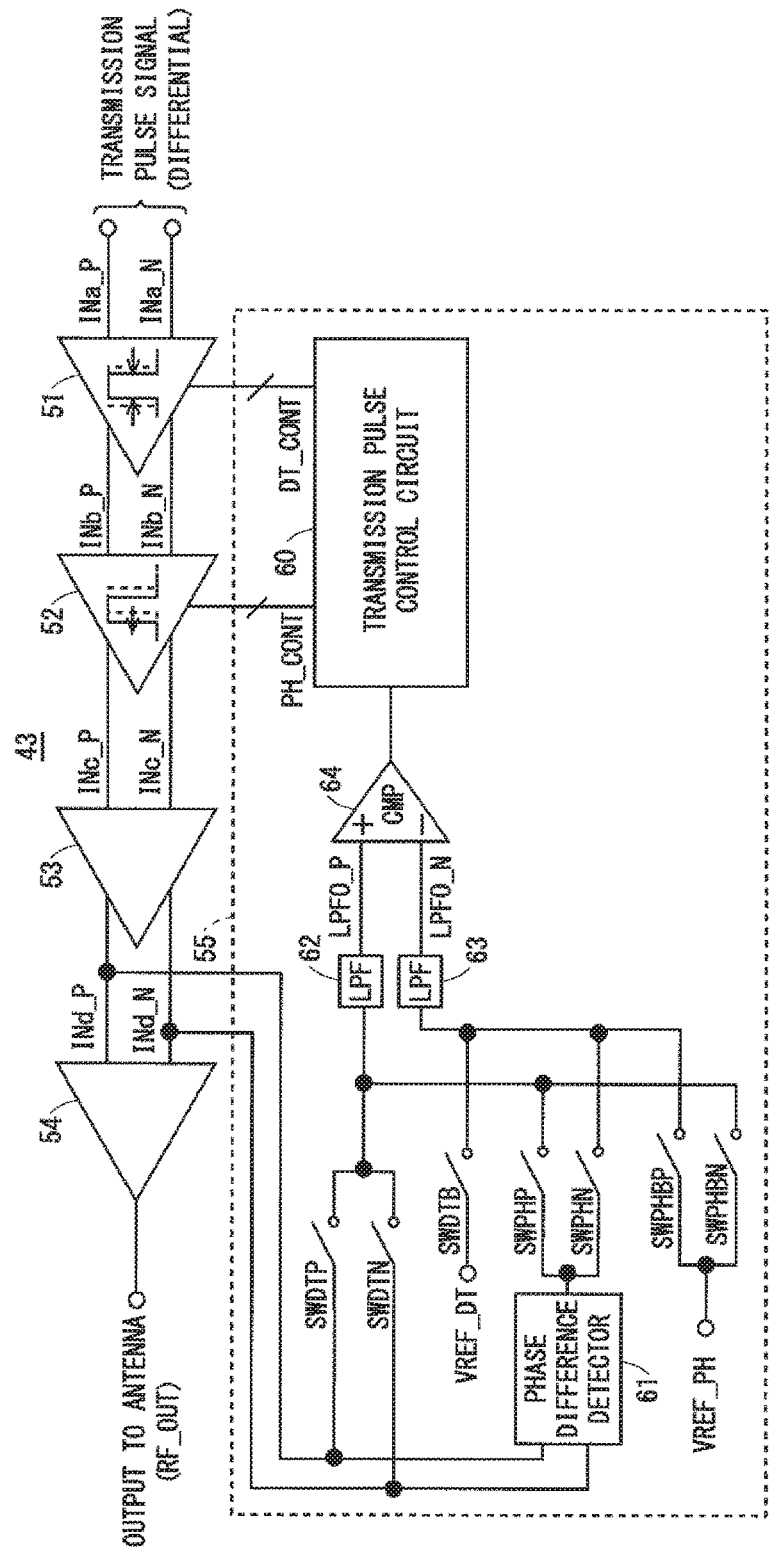
FIG. 2 is a block diagram of a power amplifier unit of a semiconductor device according to the first embodiment.

It should be noted that the power amplifier unit 43 has one of the features of the radio apparatus 1 according to the first embodiment. Therefore, the power amplifier unit 43 is explained hereinafter in a more detailed manner. FIG. 2 shows a block diagram of the power amplifier unit 43 according to the first embodiment.

As shown in FIG. 2, the power amplifier unit 43 according to the first embodiment includes a duty ratio adjustment circuit 51, a phase difference adjustment circuit 52, a pre-buffer 53, a power amplifier 54, and a phase difference setting circuit 55.

The duty ratio adjustment circuit 51 corrects duty ratios of first transmission pulses (e.g., positive transmission pulses INa_P) and second transmission pulses (e.g., negative transmission pulses INa_N) according to a duty control value and supplies duty-ratio-corrected positive and negative transmission pulses INb_P and INb_N to the phase difference adjustment circuit 52. The duty control value is generated by the phase difference setting circuit 55 and its value is supplied through a duty control signal DT_CONT.

The phase difference adjustment circuit 52 receives the positive and negative transmission pulses INb_P and INb_N output from the duty ratio adjustment circuit 51 and corrects an amount of a difference of the phase of the second transmission pulses INb_N relative to the phase of the positive transmission pulses INb_P. Then, the phase difference adjustment circuit 52 outputs positive and negative transmission pulses INc_P and INc_N having the corrected phase difference amount. Both of the positive and negative transmission pulses INb_P and INb_N have been adjusted by the duty ratio adjustment circuit 51 so that their duty ratios become lower than 50%. Further, the phase of the negative transmission pulses INb_N is delayed from the phase of the positive transmission pulses INb_P. The phase difference adjustment circuit 52 adjusts the phase difference between the positive and negative transmission pulses INb_P and INb_N based on a phase control value. This phase control value is generated by the phase difference setting circuit 55 and its value is supplied through a phase control signal PH_CONT.

The pre-buffer 53 amplifies the positive and negative transmission pulses INc_P and INc_N output from the phase difference adjustment circuit 52 and thereby generates amplified positive and negative transmission pulses INd_P and INd_N. Then, the power amplifier 54 outputs a transmission signal RF_OUT based on the positive and negative transmission pulses INd_P and INd_N. Note that the power amplifier 54 is, for example, a class E amplifier including a differential pair to which the positive and negative transmission pulses INd_P and INd_N are input and a resonant circuit driven by the differential pair.

The phase difference setting circuit 55 controls the amount of the phase difference between the positive and negative transmission pulses INc_P and INc_N by generating a phase control value according to the phase difference between the positive and negative transmission pulses INd_P and INd_N and providing the generated phase control value to the phase difference adjustment circuit 52. In the power amplifier unit 43 according to the first embodiment, the phase difference setting circuit 55 determines the phase control value so that the phase difference between the positive and negative transmission pulses INc_P and INc_N becomes 180 degrees. By adjusting the phase difference between the positive and negative transmission pulses INc_P and INc_N to 180 degrees as described above, the power amplifier unit 43 according to the first embodiment can effectively suppress a second-order distortion of the transmission signal RF_OUT.

Further, the phase difference setting circuit 55 generates a duty control value for adjusting the duty ratios of the positive and negative transmission pulses INd_P and INd_N to predefined duty ratios. In the power amplifier unit 43 according to the first embodiment, the phase difference setting circuit 55 determines the duty control value so that the duty ratios of the positive and negative transmission pulses INc_P and INc_N become lower than 50%. By adjusting the duty ratio of the positive and negative transmission pulses INc_P and INc_N to a value lower than 50% as described above, the power amplifier unit 43 according to the first embodiment can effectively suppress the maximum amplitude of the transmission signal RF_OUT and thereby effectively suppress the second-order distortion thereof.

The phase difference setting circuit 55 includes a transmission pulse control circuit 60, a phase difference detector 61, a smoothing circuit (e.g., low-pass filters 62 and 63), and a comparator 64. Further, the phase difference setting circuit 55 includes a first switch (e.g., a switch SWPHP), a second switch (e.g., a switch SWPHBP), a third switch (e.g., a switch SWPHN), a fourth switch (e.g., a switch SWPHBN), a fifth switch (e.g., a switch SWDTP), a sixth switch (e.g., a switch SWDTN), and a seven switch (e.g., a switch SWDTB). Note that it is assumed that each of the first to seventh switches is configured so that its state is switched between an On-state and an Off-state by the transmission pulse control circuit 60.

The phase difference detector 61 outputs a rectangular wave having rising edges corresponding to rising edges of the positive transmission pulses INd_P input to the power amplifier 54 and falling edges corresponding to rising edges of the negative transmission pulses INd_N input to the power amplifier 54 as a phase difference detection signal.

The positive transmission pulses INd_P are input to one end of the switch SWDTP and the other end of the switch SWDTP is connected to the low-pass filter 62. The negative transmission pulses INd_N are input to one end of the switch SWDTN and the other end of the switch SWDTN is connected to the low-pass filter 62. A duty ratio reference voltage is input to one end of the switch SWDTB and the other end of the switch SWDTB is connected to the low-pass filter 63. The phase difference detection signal is input to one end of the switch SWPHP and the other end of the switch SWPHP is connected to the low-pass filter 62. The phase difference detection signal is input to one end of the switch SWPHN and the other end of the switch SWPHN is connected to the low-pass filter 63. A phase difference reference voltage VREF_PH is input to one end of the switch SWPHBP and the other end of the switch SWPHBP is connected to the low-pass filter 63. The phase difference reference voltage VREF_PH is input to one end of the switch SWPHBN.

Each of the low-pass filters 62 and 63 includes a resistor inserted in a signal transfer line, and a capacitor disposed between a line connecting the resistor with an input terminal of the comparator 64 and a ground line. The low-pass filters 62 and 63 generate DC (Direct-Current) voltage signals (e.g., DC voltage signals LPFO_P and LPFO_N) by smoothing signals input to them and output the generated DC voltage signals to the comparator 64, which is disposed on the output side of the low-pass filters 62 and 63. The other ends of the switches SWPHP, SWPHBN, SWDTP and SWDTN are connected to the low-pass filter 62, and the other ends of the switches SWPHN, SWPHBP and SWDTB are connected to the low-pass filter 63. Further, the low-pass filters 62 and 63 output DC voltage signals that are generated by smoothing the signals input to them through switches that have been controlled to an On-state (also referred to as a "closed state")

The DC voltage signal LPFO_P output from the low-pass filter 62 is input to a non-inverting input terminal of the comparator 64 and the DC voltage signal LPFO_N output from the low-pass filter 63 is input to an inverting input terminal of the comparator 64. Further, the comparator 64 outputs a measurement result signal whose logic level is determined according to a relation between the magnitudes of two signals input the comparator 64.

The transmission pulse control circuit 60 determines a phase control value, which is supplied to the phase difference adjustment circuit 52 through the phase control signal PH_CONT, and a duty control value, which is supplied to the duty ratio adjustment circuit 51 through the duty control signal DT_CONT, based on the measurement result signal output from the comparator 64. In the following explanation, the process for determining the phase control value performed by the transmission pulse control circuit 60 is referred to as a "phase difference correction process" and the process for determining the duty control value performed by the transmission pulse control circuit 60 is referred to as a "duty ratio correction process".

In the phase correction process, the phase difference setting circuit 55 performs the following processes in a state where the switches SWDTP, SWDTN and SWDTB are maintained in an Off-state. Firstly, the phase difference detector 61 outputs a rectangular wave having rising edges corresponding to rising edges of the positive transmission pulses INd_P input to the power amplifier 54 and falling edges corresponding to rising edges of the negative transmission pulses INd_N input to the power amplifier 54 as a phase difference detection signal. Then, a DC voltage signal having a signal level corresponding to the duty ratio of the phase difference detection signal, which is obtained by smoothing the phase difference detection signal by using one of the low-pass filters 62 and 63, is output as a phase difference correspondence voltage. Further, a phase difference reference voltage VREF_PH whose voltage value is set in advance is supplied to the comparator 64 by using the other of the low-pass filters 62 and 63. Then, the comparator 64 outputs a measurement result signal whose logic level is determined according to a relation between the magnitudes of the phase difference reference voltage VREF_PH and the phase difference correspondence voltage. Then, the transmission pulse control circuit 60 increases or decreases the phase control value according to the measurement result signal. Note that in the power amplifier unit 43 according to the first embodiment, two phase correction processes, i.e., first and second phase correction processes are performed as the phase correction process.

In the first phase correction process, a first switch group consisting of switches SWPHP and SWPHBP are turned on and a second switch group consisting of switches SWPHN and SWPHBN are turned off. As a result, the phase difference setting circuit 55 supplies the phase difference detection signal to the non-inverting input terminal of the comparator 64 through the low-pass filter 62 and supplies the phase difference reference voltage VREF_PH to the inverting input terminal of the comparator 64 through the low-pass filter 63. Then, the transmission pulse control circuit 60 increases or decrease the phase control value according to a measurement result signal that is obtained by comparing the phase difference detection signal and the phase difference reference voltage VREF_PH by the comparator 64.

In the second phase correction process, the first switch group consisting of switches SWPHP and SWPHBP are turned off and the second switch group consisting of switches SWPHN and SWPHBN are turned on. As a result, the phase difference setting circuit 55 supplies the phase difference reference voltage VREF_PH to the non-inverting input terminal of the comparator 64 through the low-pass filter 62 and supplies the phase difference detection signal to the inverting input terminal of the comparator 64 through the low-pass filter 63. Then, the transmission pulse control circuit 60 increases or decrease the phase control value according to a measurement result signal that is obtained by comparing the phase difference detection signal and the phase difference reference voltage VREF_PH by the comparator 64.

In the duty ratio correction process, a first duty ratio correction process is performed in a state where the switches SWDTP and SWDTB are maintained in an On-state and a second duty ratio correction process is performed in a state where the switches SWDTN and SWDTB are maintained in an On-state.

In the first duty ratio correction process, the phase difference setting circuit 55 generates a first smoothed voltage (e.g., the DC voltage signal LPFO_P which is under the first duty ratio correction process) by smoothing the positive transmission pulses INd_P, which are input through the switch SWDTP, by using the low-pass filter 62 and supplies the generated DC voltage signal LPFO_P to the non-inverting input terminal of the comparator 64. Further, the phase difference setting circuit 55 supplies a duty ratio reference voltage VREF_DT to the inverting input terminal of the comparator 64 through the low-pass filter 63. Then, the comparator 64 outputs a measurement result signal whose logic level is determined according to a relation between the magnitudes of the duty ratio reference voltage VREF_DT and the DC voltage signal LPFO_P. Then, the transmission pulse control circuit 60 increases or decreases the duty control value according to the measurement result signal. The duty ratio adjustment circuit 51 adjusts the duty ratio of the positive transmission pulses INa_P based on the duty control value generated in the first duty ratio correction process.

In the second duty ratio correction process, the phase difference setting circuit 55 generates a second smoothed voltage (e.g., the DC voltage signal LPFO_P which is under the second duty ratio correction process) by smoothing the negative transmission pulses INd_N, which are input through the switch SWDTN, by using the low-pass filter 62 and supplies the generated DC voltage signal LPFO_P to the non-inverting input terminal of the comparator 64. Further, the phase difference setting circuit 55 supplies a duty ratio reference voltage VREF_DT to the inverting input terminal of the comparator 64 through the low-pass filter 63. Then, the comparator 64 outputs a measurement result signal whose logic level is determined according to a relation between the magnitudes of the duty ratio reference voltage VREF_DT and the DC voltage signal LPFO_P. Then, the transmission pulse control circuit 60 increases or decreases the duty control value according to the measurement result signal. The duty ratio adjustment circuit 51 adjusts the duty ratio of the negative transmission pulses INa_N based on the duty control value generated in the second duty ratio correction process.

The above-explained duty ratio adjustment circuit 51, the phase difference adjustment circuit 52, the phase difference detector 61, and the power amplifier 54 are explained hereinafter in a more detailed manner.

Figure 3:
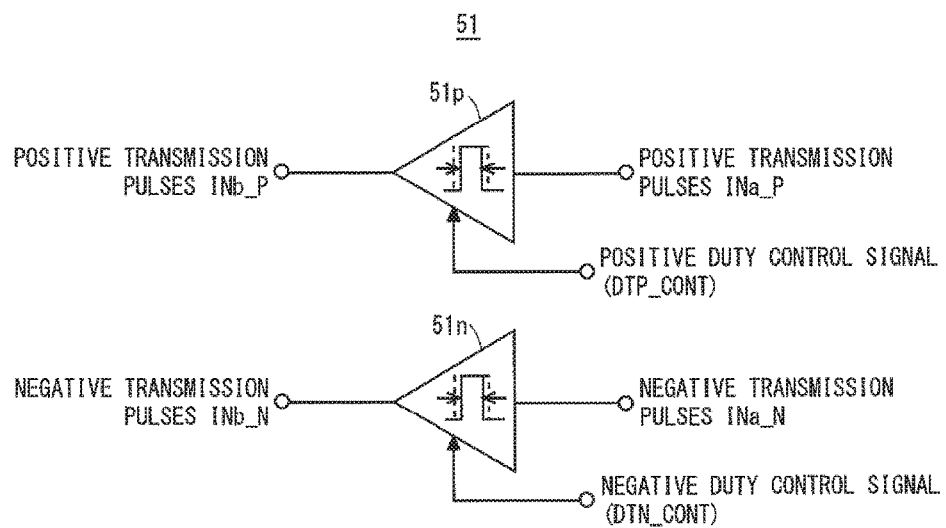
FIG. 3 is a block diagram of a duty ratio adjustment circuit according to the first embodiment.

Firstly, FIG. 3 shows a block diagram of the duty ratio adjustment circuit 51 according to the first embodiment. As shown in FIG. 3, the duty ratio adjustment circuit 51 according to the first embodiment includes a duty ratio adjustment circuit 51$p$ and a duty ratio adjustment circuit 51$n$. These duty ratio adjustment circuits 51$p$ and 51$n$ have circuit configurations identical to each other, but control signals input to them differ from each other.

The positive transmission pulses INa_P and a positive duty control signal DTP_CONT including the duty control value generated in the first duty ratio correction process, which is one of the signals included in the duty control signal DT_CONT, are input to the duty ratio adjustment circuit 51$p$. Then, the duty ratio adjustment circuit 51$p$ outputs positive transmission pulses INb_P that are obtained by adjusting the duty ratio of the positive transmission pulses INa_P based on the duty control value indicated by the positive duty control signal DTP_CONT.

The negative transmission pulses INb_N and a negative duty control signal DTN_CONT including the duty control value generated in the second duty ratio correction process, which is one of the signals included in the duty control signal DT_CONT, are input to the duty ratio adjustment circuit 51$n$. Then, the duty ratio adjustment circuit 51$n$ outputs negative transmission pulses INb_N that are obtained by adjusting the duty ratio of the negative transmission pulses INa_N based on the duty control value indicated by the negative duty control signal DTN_CONT.

Figure 4:
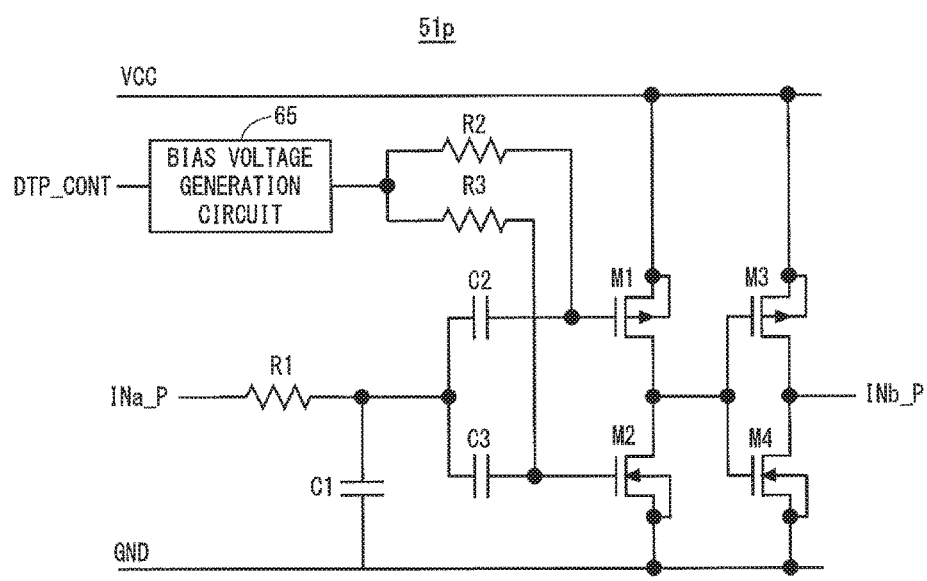
FIG. 4 is a circuit diagram of the duty ratio adjustment circuit according to the first embodiment.

Next, FIG. 4 shows a circuit diagram of the duty ratio adjustment circuit 51$p$. The circuit configurations of the duty ratio adjustment circuits 51$p$ and 51$n$ are identical to each other. As shown in FIG. 4, the duty ratio adjustment circuit 51$p$ includes resistors R1 to R3, capacitors C1 to C3, PMOS transistors M1 and M3, NMOS transistors M2 and M4, and a bias voltage generation circuit 65.

The positive transmission pulses INa_P are input to one end of the resistor R1. The capacitor C1 is connected between the other end of the resistor R1 and a ground line GND. The capacitor C2 is connected between the resistor R1 and a gate of the PMOS transistor M1. The capacitor C3 is connected between the resistor R1 and a gate of the NMOS transistor M2.

The bias voltage generation circuit 65 generates a bias voltage having a voltage that is determined according to the duty control value indicated by the positive duty control signal DTP_CONT. This bias voltage is supplied to the gate of the PMOS transistor M1 through the resistor R2. Further, the bias voltage is supplied to the gate of the NMOS transistor M2 through the resistor R3. The PMOS transistor M1 and the NMOS transistor M2 are connected in series between a power supply line VCC and the ground line GND. Further, a node that connects a drain of the PMOS transistor M1 with a drain of the NMOS transistor M2 serves as an output terminal of a first inverter circuit formed by the PMOS transistor M1 and the NMOS transistor M2.

The PMOS transistor M3 and the NMOS transistor M4 are connected in series between the power supply line VCC and the ground line GND. Further, gates of the PMOS transistor M3 and the NMOS transistor M4 are both connected to the node that connects the drain of the PMOS transistor M1 with the drain of the NMOS transistor M2. Further, a node that connects a drain of the PMOS transistor M3 with a drain of the NMOS transistor M4 serves as an output terminal of a second inverter circuit formed by the PMOS transistor M3 and the NMOS transistor M4. A signal output by this second inverter circuit is the positive transmission pulses INb_P.

In the duty ratio adjustment circuit 51$p$, a time constant circuit is formed by the resistor R1 and the capacitor C3, and the rising-edge waveform and the falling-edge waveform of the positive transmission pulses INa_P become gentler according to the time constant of the time constant circuit. Further, the higher the bias voltage becomes, the higher the threshold voltage at which the logic level of the output signal of the first inverter circuit changes becomes. Further, the lower the bias voltage becomes, the lower the threshold voltage of the first inverter circuit becomes. Further, in the duty ratio adjustment circuit 51$p$, the second inverter circuit functions as a buffer circuit for the first inverter circuit. That is, in the duty ratio adjustment circuit 51$p$, the duty ratio of the positive transmission pulses INb_P is adjusted to a desired duty ratio by changing the bias voltage output by the bias voltage generation circuit 65 and thereby shifting the edge occurrence timing of the positive transmission pulses INb_P with respect to the input timing of the edges of the positive transmission pulses INa_P.

Figure 5:
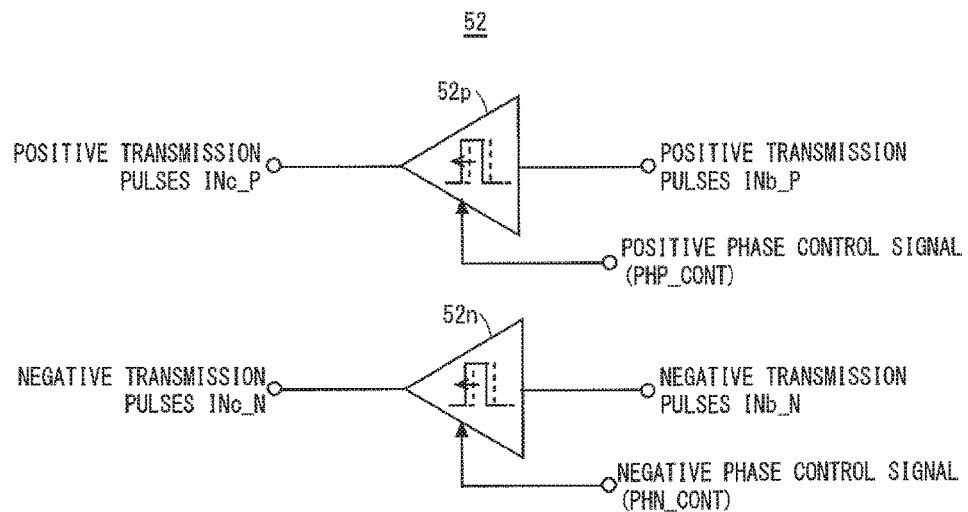
FIG. 5 is a block diagram of a phase difference adjustment circuit according to the first embodiment.

Next, FIG. 5 shows a block diagram of the phase difference adjustment circuit 52 according to the first embodiment. As shown in FIG. 5, the phase difference adjustment circuit 52 according to the first embodiment includes a phase difference adjustment circuit 52$p$ and a phase difference adjustment circuit 52$n$. These phase difference adjustment circuits 52$p$ and 52$n$ have circuit configurations identical to each other, but control signals input to them differ from each other.

The positive transmission pulses INb_P and a positive phase control signal PHP_CONT including a positive-side phase control value generated in the phase difference correction process, which is one of the signals included in the phase control signal PH_CONT, are input to the phase difference adjustment circuit 52$p$. Then, the phase difference adjustment circuit 52$p$ corrects the phase difference of the positive transmission pulses INb_P relative to the negative transmission pulses INb_N based on the positive-side phase control value indicated by the positive phase control signal PH_CONT. The signal output by the phase difference adjustment circuit 52$p$ is referred to as "positive transmission pulses INc_P".

The negative transmission pulses INb_N and a negative phase control signal PHN_CONT including a negative-side phase control value generated in the phase difference correction process, which is one of the signals included in the phase control signal PH_CONT, are input to the phase difference adjustment circuit 52n. Then, the phase difference adjustment circuit 52n corrects the phase difference of the negative transmission pulses INb_N relative to the positive transmission pulses INb_P based on the negative-side phase control value indicated by the negative phase control signal PH_CONT. The signal output by the phase difference adjustment circuit 52n is referred to as "negative transmission pulses INc_N".

Figure 6:
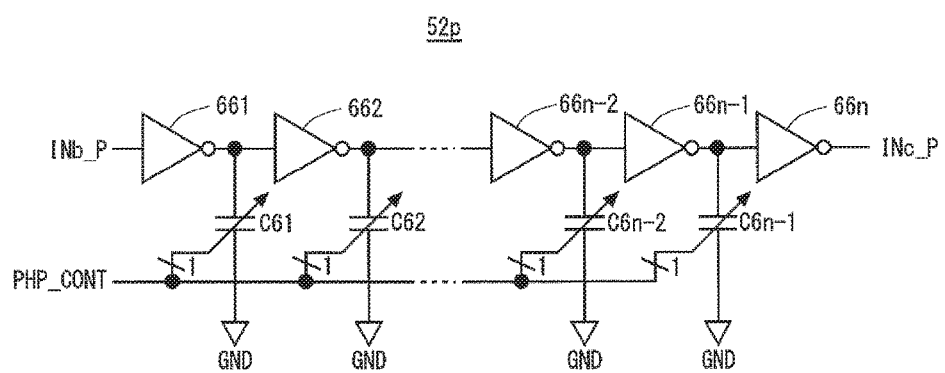
FIG. 6 is a circuit diagram of the phase difference adjustment circuit according to the first embodiment.

Next, FIG. 6 shows a circuit diagram of the phase difference adjustment circuit 52p. The circuit configurations of the phase difference adjustment circuits 52p and 52n are identical to each other. As shown in FIG. 6, the phase difference adjustment circuit 52p includes inverters 661 to 66n (n is an integer indicating the number of inverters, the same is applied below) and capacitors C61 to C6n-1.

The inverters 661 to 66n are connected in series. Further, the positive transmission pulses INb_P are input to the first inverter 661 and the last inverter 66n outputs the positive transmission pulses INc_P. Further, the capacitors C61 to C6n-1 are connected between output terminals of the inverters 661 to 66n-1, respectively, and a ground line GND. For each of the capacitors C61 to C6n-1, a value of one of the bits included in the positive phase control signal PHP_CONT corresponding to that capacitor is supplied. That is, the phase control value indicated by the positive phase control signal PHP_CONT includes the same number of bits as the number of capacitors. When the value of the bit that is input to a corresponding one of the capacitors C61 to C6n-1 is "1", a capacitance value set for that capacitor is enabled, whereas when the value of the bit input to the capacitor is "0", the capacitance value is disabled (e.g., is set to OF).

That is, in the phase difference adjustment circuit 52p, an amount of delay of the negative transmission pulses INc_N from the negative transmission pulses INb_N, which propagates through the base difference adjustment circuit 52n and is output therefrom, is adjusted by changing the number of enabled capacitors and the number of disabled capacitors disposed between the series-connected inverters according to the phase control value. As described above, in the phase difference adjustment circuit 52, by correcting a difference between the amount of delay of the positive transmission pules, which are made to propagate through the phase difference adjustment circuit 52p, and the amount of delay of the negative transmission pules, which are made to propagate through the phase difference adjustment circuit 52n, according to the phase control value, the phase difference between these two transmission pulse signals is adjusted.

Next, the phase difference detector 61 is explained. The phase difference detector 61 is configured to detect a difference between input timings of rising edges of two transmission pulse signals. The phase difference detector 61 outputs a pulse signal having a rectangular wave having rising edges and falling edges corresponding to the difference between the input timings of rising edges of these two transmission pulse signals as a phase difference detection signal. Various circuits are conceivable as a circuit for implementing the operation of the phase difference detector 61 and any kind of logic circuit that satisfies a specific input/output relation may be used.

Figures 7, 8:
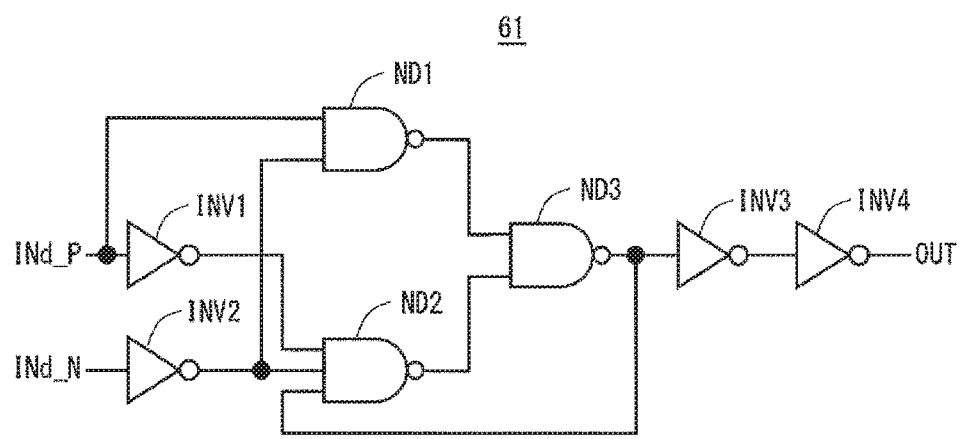
FIG. 7 is a truth table of a phase detector according to the first embodiment.
FIG. 8 is a circuit diagram of the phase detector according to the first embodiment.

Accordingly, FIG. 7 shows a truth table of the phase difference detector 61 according to the first embodiment. As shown in FIG. 7, the phase difference detector 61 according to the first embodiment maintains the previous output state when both of the positive and negative transmission pulses INc_P and INc_N are "0". The phase difference detector 61 brings the logic level of the phase difference detection signal, which becomes the output signal OUT, to "0" when the positive transmission pulse INc_P is "0" and the negative transmission pulse INc_N is "1". The phase difference detector 61 brings the logic level of the phase difference detection signal, which becomes the output signal OUT, to "1" when the positive transmission pulse INc_P is "1" and the negative transmission pulse INc_N is "0". The phase difference detector 61 brings the logic level of the phase difference detection signal, which becomes the output signal OUT, to "0" when both of the positive and negative transmission pulses INc_P and INc_N are "1".

An example of a circuit that implements the operation expressed as this truth table shown in FIG. 7 is explained. FIG. 8 shows an example of a circuit diagram of a phase difference detector according to the first embodiment. In the example shown in FIG. 8, the phase difference detector 61 includes inverter circuits INV1 to INV4 and NAND circuits ND1 to ND3.

The inverter circuit INV1 inverts the positive transmission pulses INd_P and outputs the inverted pulses. The inverter circuit INV2 inverts the negative transmission pulses INd_N and outputs the inverted pulses. The NAND circuit ND1 calculates an inverted logical addition of the positive transmission pulses INd_P and the pulses obtained by inverting the negative transmission pulses INd_N by the inverter circuit INV2, and outputs the calculation result. The NAND circuit ND2 calculates an inverted logical addition of the output signal of the inverter circuit INV1, the output signal of the inverter circuit INV2, and the output signal of the NAND circuit ND3, and outputs the calculation result. The NAND circuit ND3 calculates an inverted logical addition of the output signal of the NAND circuit ND1 and the output signal of the NAND circuit ND2, and outputs the calculation result. The output signal of this NAND circuit ND3 is output as a phase difference detection signal (indicated by "OUT" in the figure) from the inverter circuit INV4 while using the inverter circuits INV3 and INV4 as a buffer circuit.

Figure 9:
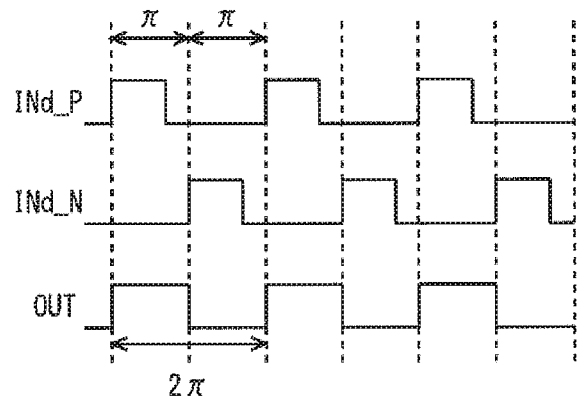
FIG. 9 is a timing chart for explaining an operation of the duty ratio adjustment circuit according to the first embodiment.
Figure 9:
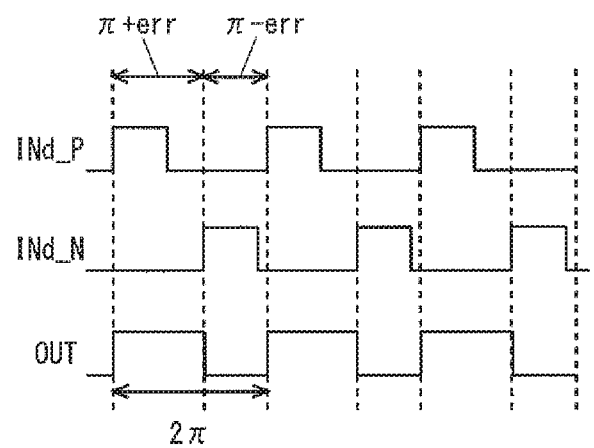

Here, FIG. 9 shows a timing chart showing an operation of the phase difference detector 61 according to the first embodiment. The operation of the phase difference detector 61 according to the first embodiment is explained with reference to FIG. 9.

As shown in FIG. 9, the cycle of the phase difference detection signal output by the phase difference detector 61 is equal to the cycle ($2n$) of the transmission pulses. Further, when the phase difference between the two transmission pulse signals is an ideal value of 180°, the high-level period and the low-level period of the phase difference detection signal are both n. That is, in the phase difference detector 61, when the phase difference between the two input transmission pulse signals is 180°, the duty ratio of the output phase difference detection signal is 50%.

In contrast, when the phase difference between the two transmission pulse signals is deviated from the ideal value of 180° by $\Delta PH$, the high-level period of the phase difference detection signal becomes $\pi + \Delta PH/2$ and the low-level period thereof becomes $\pi - \Delta PH/2$. That is, in the phase difference detector 61, when the phase difference between the two input transmission pulse signals is deviated from 180°, the duty ratio is deviated from 50% by an amount corresponding to the amount of the phase deviation.

Note that a relation between the phase deviation amount $\Delta PH$ between the two transmission pulse signals and the duty ratio DTout of the phase difference detection signal output by the phase difference detector 61 can be expressed by the below-shown Expression (1).

[Expression 1]

$$DTout = \left(\frac{1}{2} + \frac{\Delta PH}{2\pi}\right) \times 100 \quad (1)$$

Next, a circuit configuration of the power amplifier 54 according to the first embodiment is explained. In the power amplifier unit 43 according to the first embodiment, a class E amplifier is used as the power amplifier 54. In a transmission system of a radio chip that handles signals in a sub-giga Hz band, it is required to have a high transmission output and low power consumption and to minimize the number of external matching components. Here, a smart meter is assumed as an example of a radio communication apparatus.

In countries with enormous lands, a radio communication distance from a smart meter to a concentrator, which transfers data to a power company, tends to be very long. Therefore, a radio communication apparatus is required to have a high transmission output characteristic for performing communication with a radio-wave strength of about 20 dBm as well as a low reception sensitivity characteristic capable of receiving a lower radio-wave strength. However, there is a problem that, in such a transmission system having a high transmission power, power consumption increases. In general, power that can be consumed inside a smart meter is specified and therefore it is necessary to reduce the power consumption of the radio chip. Further, considering that a radio communication apparatus may be applied to a gas meter as an aspect thereof, it is necessary to take a situation in which no electricity is supplied to the radio communication apparatus into consideration and take a situation in which the radio communication apparatus is powered by a battery into consideration. Therefore, a high-power amplifier that carries out a high power transmission from a radio chip is required to have high power efficiency.

Meanwhile, out-of-band spurious radiation of a transmission output radiated from a radio chip is specified in a communication standard in each country. To comply with the aforementioned standard, the toughest transmission characteristic is harmonic characteristics that are caused at frequencies integral multiples of the operating frequency due to the nonlinearity of the circuit. To suppress these harmonics, a matching circuit including a filter is formed in a part of the output-stage circuit of the high power amplifier on the substrate. However, when all the harmonics are suppressed by using external filters, the number of external components increases, thus leading to an increase in cost. Further, the second-order harmonic is close to the operating frequency. Therefore, there is a problem that when the second-order harmonic is suppressed by a filter having a low Q value, the transmission output power and the efficiency are deteriorated. Therefore, it is important to suppress harmonics as much as possible inside the radio chip. In particular, it is very important to use a second-order harmonic suppression technique using no filter in order to improve the transmission performance as well as to reduce the cost for external components.

Both of the high transmission power characteristic and the high power efficiency can be achieved at the same time by using a class E power amplifier as the power amplifier. The class E operation means an operating mode having such a waveform that a voltage and a current occur in a reciprocal manner and an inclination of the voltage becomes zero at the moment when the voltage becomes zero.

Figure 10:
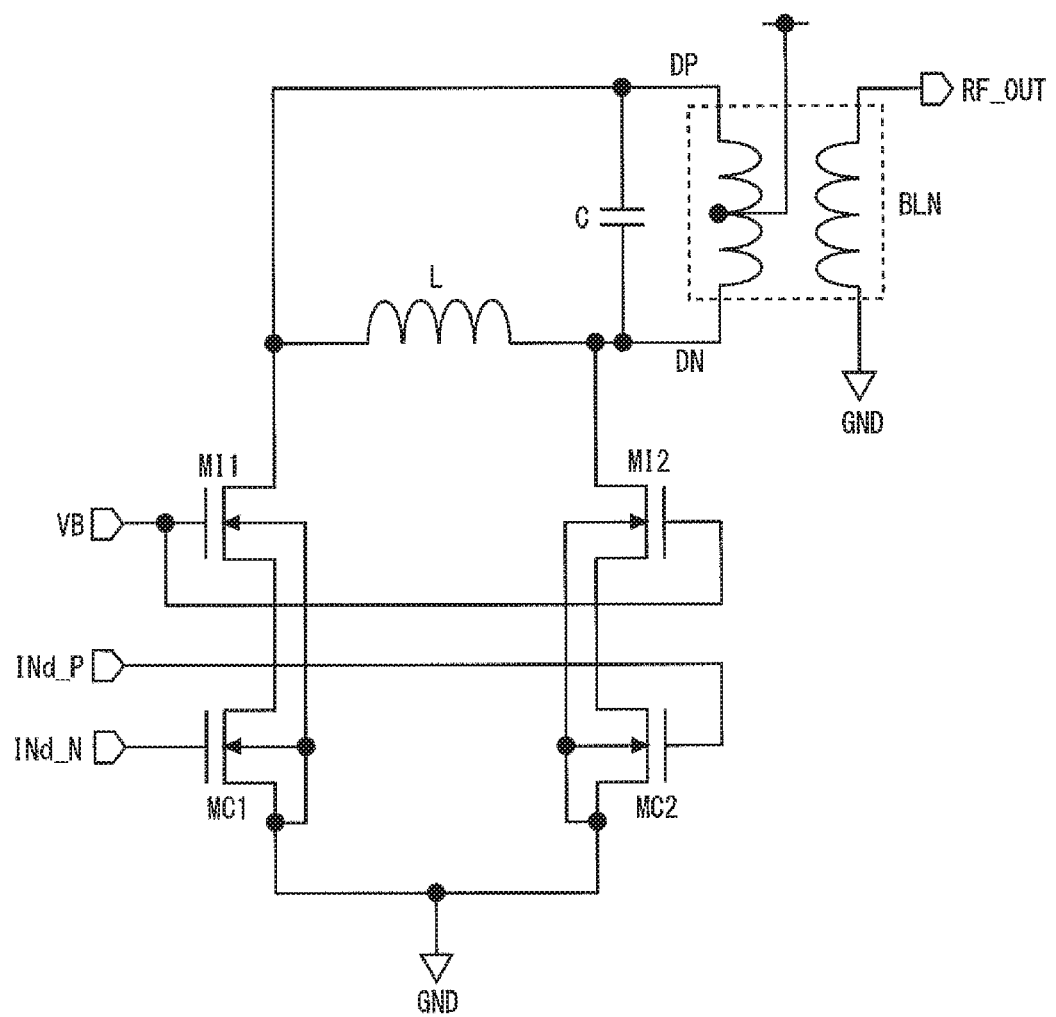
FIG. 10 is a circuit diagram of a power amplifier according to the first embodiment.

Accordingly, FIG. 10 shows a circuit diagram of the power amplifier 54 according to the first embodiment. As shown in FIG. 10, the power amplifier 54 according to the first embodiment includes NMOS transistors MC1, MC2, MI1 and MI2, an inductor L, a capacitor C, and a balun BLN.

The NMOS transistors MC1 and MC2 form a differential pair. Further, sources of the NMOS transistors MC1 and MC2 are connected to a ground line. Negative transmission pulses INd_N are input to a gate of the NMOS transistor MC1. Positive transmission pulses INd_P are input to a gate of the NMOS transistor MC2.

A source of the NMOS transistor MI1 is connected to a drain of the NMOS transistor MC1. A bias voltage VB having a predefined voltage value is supplied to a gate of the NMOS transistor MI1. A source of the NMOS transistor MI2 is connected to a drain of the NMOS transistor MC2. The bias voltage VB is supplied to a gate of the NMOS transistor MI2.

The inductor L is connected between the drains of the NMOS transistors MI1 and MI2. Further, the capacitor C is disposed so as to be connected in parallel with the inductor L. The balun BLN allows only an operating frequency component to pass therethrough by parallel resonance with the capacitor C and converts the differential signal into a single-phase signal. A primary coil of the balun BLN is connected in parallel with the capacitor C. One end of a secondary coil of the balun BLN is connected to the ground line and a transmission signal RF_OUT is output from the other end of the secondary coil.

Note that since the NMOS transistors MC1 and MC2 need to operate as switches, low withstand-voltage MOSFETs having high driving capabilities are used for them. Further, in the example shown in FIG. 10, the NMOS transistors MI1 and MI2 are provided in order to supplement the low withstand voltage of the NMOS transistors MC1 and MC2. However, depending on the required withstand voltage of the NMOS transistors MC1 and MC2, the transistors for increasing the withstand-voltage connected in series with the NMOS transistors MC1 and MC2 (e.g., the NMOS transistors MI1 and MI2) can be eliminated. Alternatively, two or more pairs of transistors may be connected in series with the NMOS transistors MC1 and MC2.

Figure 11:
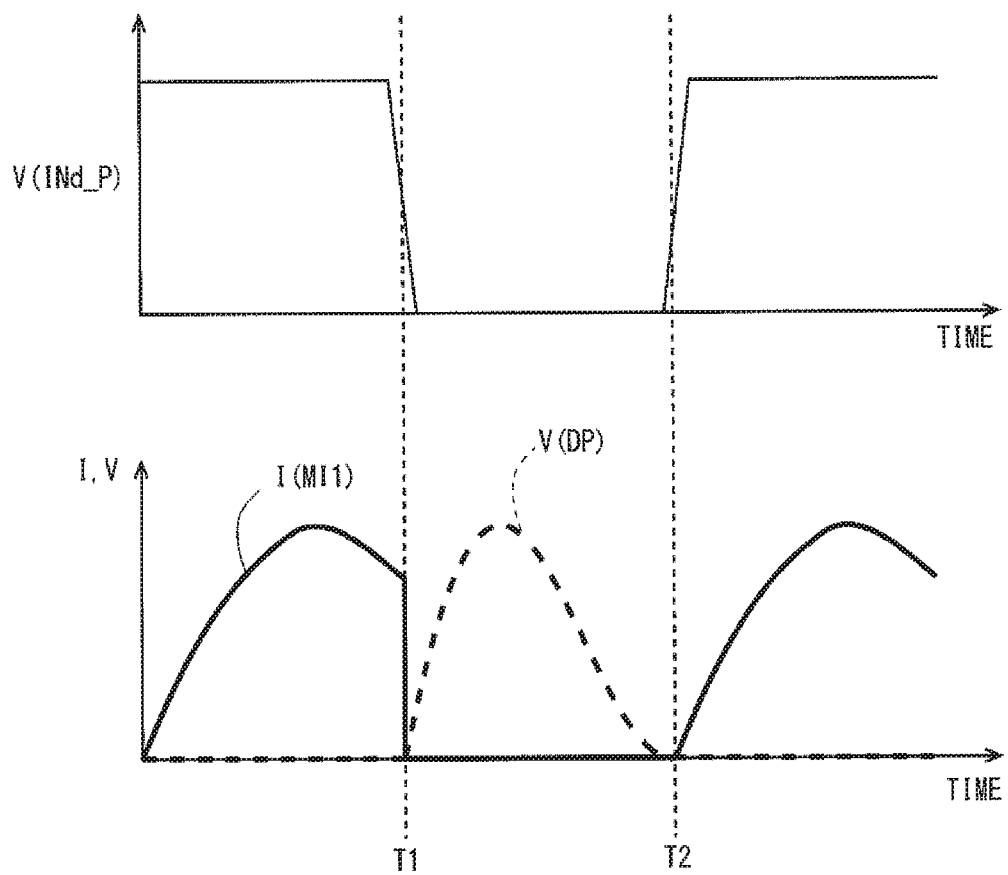
FIG. 11 is a timing chart for explaining an operation of the power amplifier according to the first embodiment.

An operation characteristic of the power amplifier 54 that performs the class E operation is explained hereinafter. FIG. 11 shows a timing chart for explaining an operation of the power amplifier 54 according to the first embodiment. As shown in FIG. 11, in the power amplifier 54, positive transmission pulses INd_P and negative transmission pulses INd_N having rectangular waves are input to the gates of the NMOS transistors MC1 and MC2 as input signals in order to make the NMOS transistors MC1 and MC2 perform switching operations. Then, when the positive transmission pulses INd_P become a high level, the NMOS transistor MC1 is turned on. Therefore, a voltage V(DP) of a node DP of the primary coil of the balun BLN on the NMOS transistor MC1 side becomes 0V. Further, a current I(MI1) that flows between the drain and the source of the NMOS transistor MI1 becomes a sine wave signal because the balun BLN allows only the operating frequency component to pass therethrough.

Next, when the positive transmission pulses INd_P become a low level (e.g., at a timing T1), the NMOS transistor MC1 is turned off. In this state, as shown in FIG. 11, the voltage V(DP) has such a waveform that it temporarily rises and falls again. Meanwhile, the current I(MI1) is 0 A in the period in which the positive transmission pulses INd_P are at the low level.

Further, when the positive transmission pulses INd_P become a high level again (e.g., at a timing T2), the NMOS transistor MI1 changes to an On-state. In order to prevent power from being consumed at the moment of this state change of the NMOS transistor MI1, the power amplifier 54 is designed so that the voltage V(DP) becomes 0V and its inclination also becomes zero. This feature can be achieved by adjusting the inductor L and the parasitic capacitance present in the NMOS transistor MI1.

In a power amplifier, power is consumed when an output voltage and a current of an active component occur at the same time. However, by forming the waveform explained above with reference to FIG. 11, no power is consumed even at the moment when the state of the NMOS transistor MC1 or MC2, which functions as a switch, is switched between an On-state and an Off-state and hence the theoretical efficiency becomes 100%. Therefore, the power amplifier that performs the class E operation can achieve high efficiency.

Figure 12:
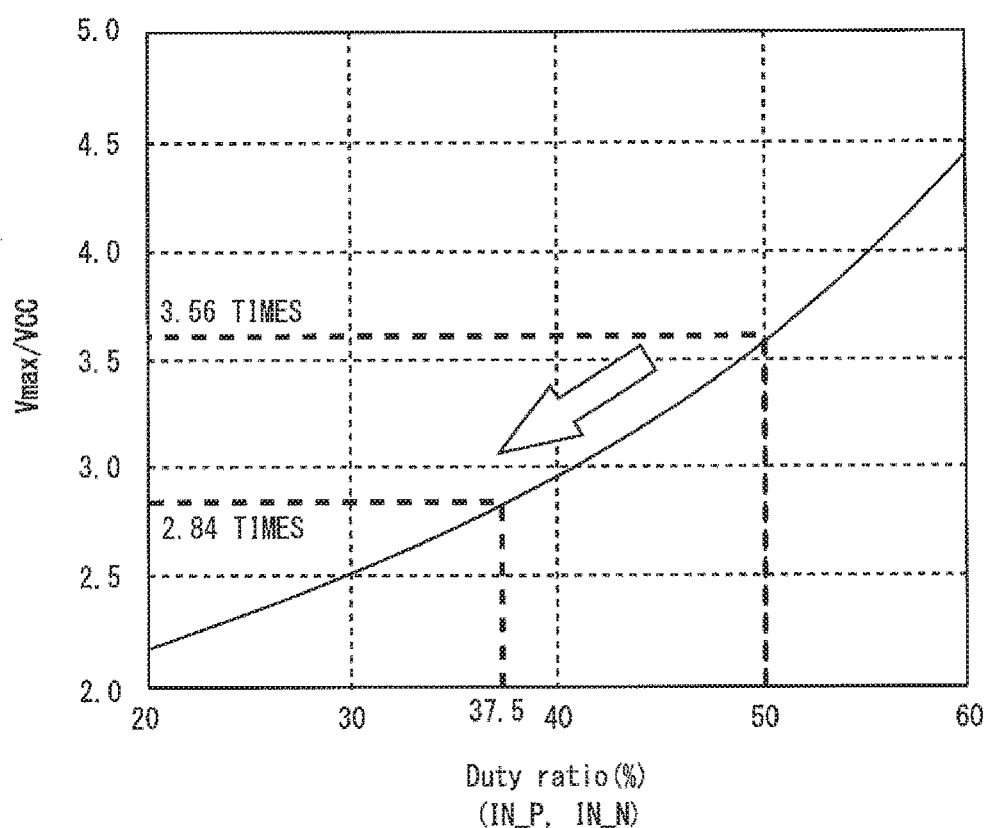
FIG. 12 is a graph for explaining a relation between a duty ratio of transmission pulses and an amplitude of a transmission signal in the power amplifier according to the first embodiment.

Meanwhile, the withstand voltage of active components is an important challenge in the power amplifier 54 that performs the class E operation. For this problem, it is possible to reduce the voltage applied to the transistor by reducing the duty ratio of the input rectangular-wave signal. Accordingly, FIG. 12 is a graph for explaining a relation between a duty ratio of transmission pulses and an amplitude of a transmission signal in the power amplifier according to the first embodiment. The graph shown in FIG. 12 is created based on theoretical values that can be derived by calculation. In FIG. 12, the horizontal axis indicates the duty ratio of the positive and negative transmission pulses INd_P and INd_N, and the vertical axis indicates the peak voltage of the amplitude of output signals normalized by the power supply voltage.

Since the duty ratio of the positive and negative transmission pulses INa_P and INa_N input to the power amplifier unit 43 is 50%, the duty ratio of the positive and negative transmission pulses INd_P and INd_N input to the power amplifier 54 is 50% unless the duty ratio adjustment circuit 51 is used. Referring to FIG. 12, when the duty ratio of the input signal to the power amplifier 54 is 50%, the amplitude of the transmission signal RF_OUT becomes 3.56 times of the power supply voltage. Therefore, a voltage resulting from the maximum amplitude of the transmission signal RF_OUT occurs in the drains of the NMOS transistors MI1 and MI2. For example, when the power supply voltage is 3V, the maximum amplitude of the transmission signal RF_OUT reaches 10.7V. Therefore, the withstand voltage of components becomes a significant problem even when high withstand-voltage MOS transistors are used as the NMOS transistors MI1 and MI2.

Meanwhile, referring to FIG. 12, it can be understood that the amplitude of the transmission signal RF_OUT can be reduced by reducing the duty ratio of the input signal. For example, when the duty ratio is 37.5%, the amplitude of the transmission signal RF_OUT becomes 2.84 times of the power supply voltage. This means that when the power supply voltage is 3V, the maximum amplitude of the transmission signal RF_OUT can be reduced to 8.5V.

Further, in the radio apparatus 1 according to the first embodiment, it is possible to reduce the area on the substrate in which components are mounted and the total cost by using the power amplifier unit 43 according to the first embodiment. This is because since the second-order distortion of the transmission signal RF_OUT is suppressed by using the power amplifier unit 43, the number of external components for the matching circuit can be reduced.

The power amplifier unit 43 can be implemented by, for example, providing two paths of single-phase circuit structures in the duty ratio adjustment circuit 51, the phase difference adjustment circuit 52, and the like, and driving the power amplifier 54 by phase-inverted input signals. A problem of the power amplifier unit 43 is that when there are variations among components, a difference is caused between the transfer functions of the two paths through which the positive and negative transmission pulses INa_P and INa_N are respectively transmitted to the power amplifier 54, thus deteriorating the suppression of even-number-order harmonics. For example, in the case where rectangular-wave signals are input to the power amplifier unit 43, this difference between transfer functions appears as a duty ratio error and a phase error. The even-number-order harmonics are deteriorated due to these errors. Note that the duty ratio error is a difference between duty ratios of two signals constituting a differential signal and the phase error is a value indicating how much the phase difference between the two signals constituting the differential signal is deviated from 180°.

Note that when the rectangular-wave signal is expressed by a frequency, it can be expressed by the below-shown Expression (2).

[Expression 2]

$$Vsq(\omega) = \frac{2VDD}{\pi}\left[\frac{\pi}{2}DT + \sin(\pi \cdot DT)\cos(\omega t) + \frac{1}{2}\sin(2\pi \cdot DT)\cos(2\omega t) + \frac{1}{3}\sin(3\pi \cdot DT)\cos(3\omega t) + \dots \right] \quad (2)$$

In Expression (2): the duty ratio of the rectangular-wave input signal is represented by DT; the power supply voltage of the circuit is represented by VDD; and the angular frequency is represented by ω.

By examining the even-number-order harmonic characteristics due to the difference between duty ratios, error components that affect the even-number-order harmonics are recognized. For example, when the duty ratio of the rectangular-wave input signal is 50%, the DT becomes 0.5. Then, the second-order harmonic component, which corresponds to the third term in Expression (2), becomes sin(2π) cos(2ωt) and hence becomes zero. Similarly, each of the other even-number-order harmonics also becomes zero. Therefore, when the power amplifier 54 is driven by a rectangular-wave signal having a duty ratio of 50%, no even-number-order harmonic occurs. However, when there are variations among components in the duty ratio adjustment circuit 51, the phase difference adjustment circuit 52, and the like, the duty ratio is deviated from 50% and hence even-number-order harmonics occur.

Next, a case where the duty ratio is 37.5% is examined. The DT becomes 0.375. Then, the second-order harmonic component of Expression (2) becomes sin(0.75π)cos(2ωt) and hence the third term in Expression (2) has a finite value. When attention is paid only to one of the rectangular-wave signals, a second-order harmonic occurs. However, by setting the phase difference between one of the input signals (e.g., the positive transmission pulses INd_P) and the other input signals (e.g., the negative transmission pulses INd_N)

to 180°, their even-number-order harmonic components are cancelled out. However, when there are variations among components in the duty ratio adjustment circuit 51, the phase difference adjustment circuit 52, and the like, which process the differential signal, a duty ratio error and a phase error occur and hence even-number-order harmonics deteriorate. Therefore, in the case in which the duty ratio is 50%, even-number-order harmonics deteriorate when the duty ratio is deviated from 50%. Further, when the duty ratio is not 50%, a duty ratio error and a phase error occur and hence even-number-order harmonics deteriorate. In a case in which the duty ratio is not 50% or the specification of even-number-order harmonics is very strict, the use of the power amplifier 54 as the output circuit in the transmission system alone does not achieve suppression in a satisfactory level. Therefore, it is necessary to completely eliminate the cause of deterioration that occurs when there are variations among components.

Figure 13:
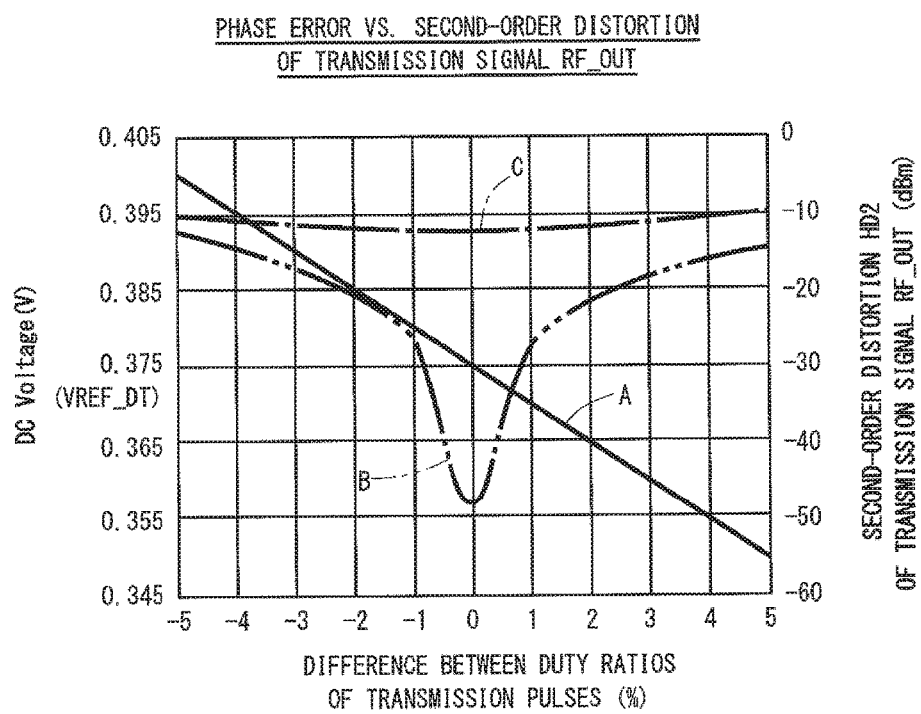
FIG. 13 is a graph for explaining a relation between a phase error of transmission pulses and a second-order harmonic distortion of a transmission signal in the power amplifier according to the first embodiment.

Therefore, in the power amplifier unit 43 according to the first embodiment, the phase difference between the positive and negative transmission pulses INa_P and INa_N is adjusted to 180° while the duty ratio of the positive and negative transmission pulses INa_P and INa_N, which are input to the power amplifier 54, is adjusted to 50% or lower by using the duty ratio adjustment circuit 51, the phase difference adjustment circuit 52, and the phase difference setting circuit 55. Accordingly, FIG. 13 shows a graph for explaining a relation between a phase error of transmission pulses and a second-order harmonic distortion of a transmission signal in the power amplifier according to the first embodiment. In particular, FIG. 13 shows a graph showing a second-order distortion characteristic of the power amplifier 54 when the duty ratio of the positive and negative transmission pulses INa_P and INa_N is adjusted to 37.5%. Further, FIG. 13 shows a relation between the characteristic of a DC voltage signal LPFO_P, which is output by the low-pass filter 62 when the duty ratio is swept near 37.5%, and a duty ratio reference voltage VREF_DT.

As shown in FIG. 13, in the power amplifier unit 43 according to the first embodiment, when the duty ratio of the positive and negative transmission pulses INd_P and INd_N is adjusted to 37.5%, the voltage value of the DC voltage signal LPFO_P output by the low-pass filter 62 and the duty ratio reference voltage VREF_DT become equal to each other. Further, regarding the second-order distortion characteristic of the transmission signal RF_OUT, it can be understood that the second-order distortion characteristic is minimized at the point where the difference between the duty ratios of the two transmission pulse signals is zero. Therefore, in the power amplifier unit 43 according to the first embodiment, an adjustment is performed by using the duty ratio adjustment circuit 51 and the phase difference setting circuit 55 so that the duty ratios of the positive and negative transmission pulses INd_P and INd_N become equal to each other.

Further, the second-order distortion of the transmission signal RF_OUT can be suppressed to −48 dBm by adjusting the phase difference between the positive and negative transmission pulses INd_P and INd_N to 180° in the state where the duty ratio of these two transmission signals is adjusted to 37.5%. In contrast to this, when the phase difference between the positive and negative transmission pulses INd_P and INd_N is 190° in the state where the duty ratio of these two transmission signals is adjusted to 37.5%, the second-order distortion of the transmission signal RF_OUT can be suppressed only to about −12.1 dBm. Therefore, in the power amplifier unit 43 according to the first embodiment, the phase difference between the positive and negative transmission pulses INd_P and INd_N is adjusted to 180° by the phase difference adjustment circuit 52 and the phase difference setting circuit 55.

Figure 14:
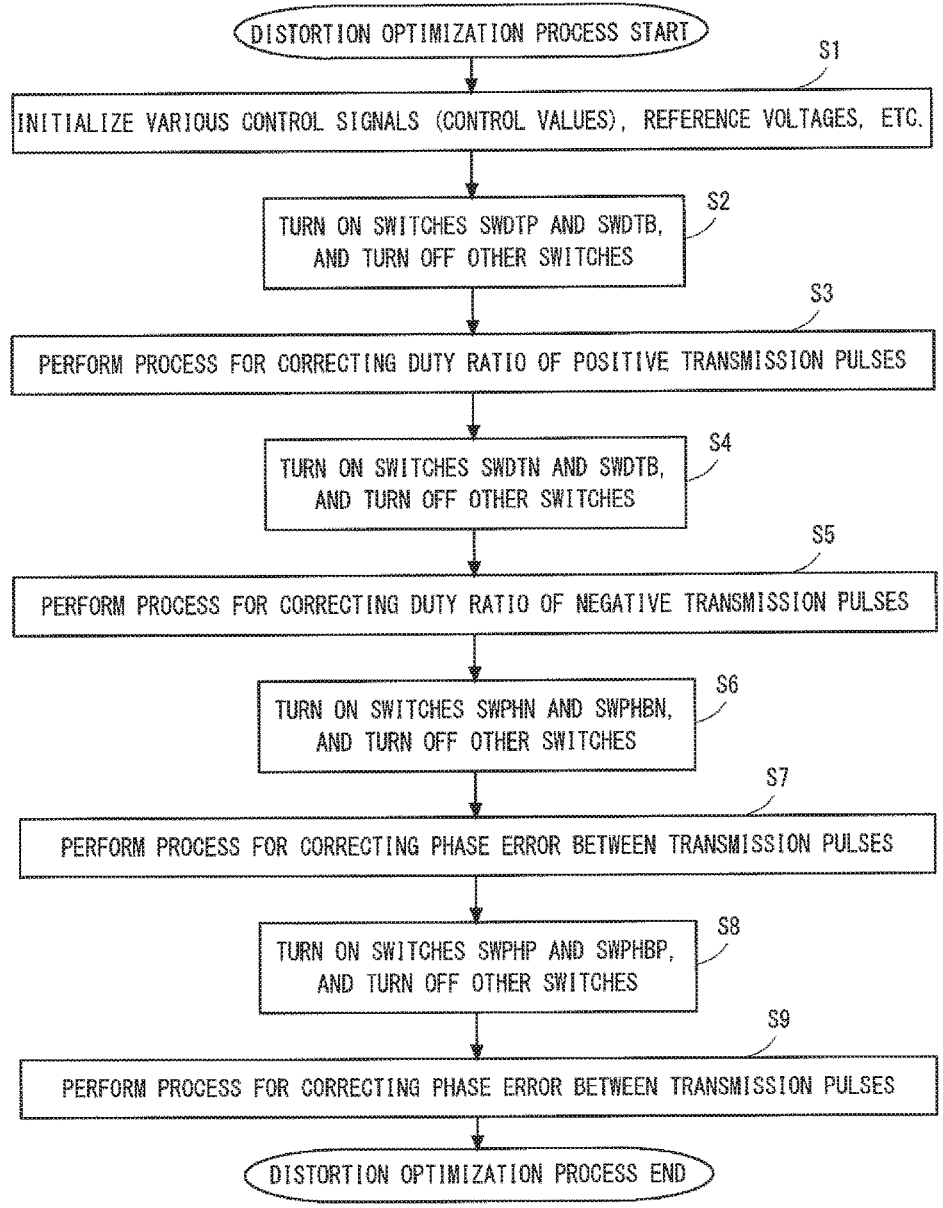
FIG. 14 is a flowchart for explaining a flow of a distortion optimization process in a power amplifier unit according to the first embodiment.

Next, a distortion optimization process for optimizing the distortion characteristic of the transmission signal RF_OUT (e.g., a duty ratio adjustment process and a phase difference adjustment process) in the power amplifier unit 43 according to the first embodiment is explained. FIG. 14 shows a flowchart for explaining a flow of a distortion optimization process in the power amplifier unit according to the first embodiment.

In the radio apparatus 1 according to the first embodiment, the distortion optimization process shown in FIG. 14 is performed when a predetermined condition is satisfied, such as when the radio apparatus 1 is started, when the internal temperature of the radio apparatus 1 meets a predefined condition, and when the operating time of the radio apparatus 1 exceeds a specific time period.

As shown in FIG. 14, in the distortion optimization process of the power amplifier unit 43 according to the first embodiment, firstly, each value in the power amplifier unit 43 is initialized (step S1). In the step S1, for example, values indicated by the duty control signal DT_CONT and the phase control signal PH_CONT, values of the duty ratio reference voltage VREF_DT and the phase difference reference voltage VREF_P, and so on are initialized.

Next, in the power amplifier unit 43 according to the first embodiment, a first duty ratio correction process is performed (steps S2 and S3). In the step S2, the phase difference setting circuit 55 turns on the switches SWDTP and SWDTB and turns off the other switches. As a result, in the phase difference setting circuit 55, a DC voltage signal LPFO_P having a voltage level that is determined according to the duty ratio of the positive transmission pulses INd_P is input to the non-inverting input terminal of the comparator 64 and the duty ratio reference voltage VREF_DT is input to the inverting input terminal of the comparator 64. In the step S3, the phase difference setting circuit 55 performs a process for correcting the duty ratio of the positive transmission pulses INd_P, which reach the power amplifier 54 through the duty ratio adjustment circuit 51p, while changing the duty control value indicated by the duty control signal DT_CONT in accordance with a predetermined sequence.

Figure 15:
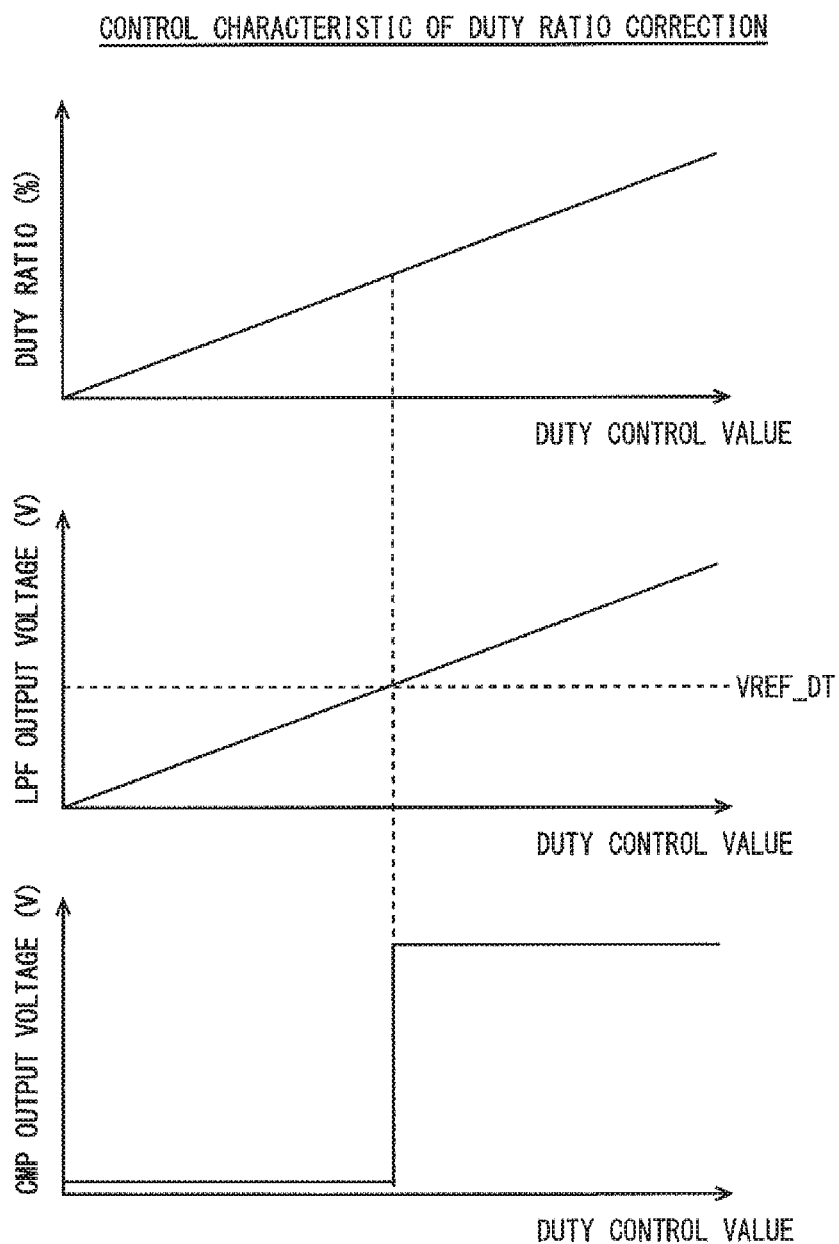
FIG. 15 is a graph for explaining a control characteristic of a duty ratio correction in the power amplifier unit according to the first embodiment.

A method for changing the duty control value is explained hereinafter. FIG. 15 shows a graph for explaining a control characteristic of a duty ratio correction in the power amplifier unit according to the first embodiment. In the power amplifier unit 43 according to the first embodiment, when the duty control value is increased, the duty ratio of the positive transmission pulses INd_P is increased. Further, the voltage value of the DC voltage signal LPFO_P output from the low-pass filter 62 rises in proportion to the increase in the duty ratio of the positive transmission pulses INd_P. A measurement result signal output by the comparator 64 becomes a low level when the DC voltage signal LPFO_P is lower than the duty ratio reference voltage VREF_DT and becomes a high level when the DC voltage signal LPFO_P is higher than the duty ratio reference voltage VREF_DT. The phase difference setting circuit 55 observes the measurement result signal output from the comparator 64 while changing the duty control value based on a binary search or changing the duty control value by sweeping it, and thereby determines the duty control value by which the duty ratio of the positive transmission pulses INd_P becomes a ratio corresponding to the duty ratio reference voltage VREF_DT.

Next, the power amplifier unit 43 according to the first embodiment performs a second duty ratio correction process is performed (steps S4 and S5). In the step S4, the phase difference setting circuit 55 turns on the switches SWDTN and SWDTB and turns off the other switches. As a result, in the phase difference setting circuit 55, the DC voltage signal LPFO_P having a voltage level that is determined according to the duty ratio of the negative transmission pulses INd_N is input to the non-inverting input terminal of the comparator 64 and the duty ratio reference voltage VREF_DT is input to the inverting input terminal of the comparator 64. In the step S5, the phase difference setting circuit 55 performs a process for correcting the duty ratio of the negative transmission pulses INd_N, which reach the power amplifier 54 through the duty ratio adjustment circuit 51n, while changing the duty control value indicated by the duty control signal DT_CONT in accordance with a predetermined sequence. The method for searching for the duty control value in this second duty ratio correction process is substantially the same as that in the first duty ratio correction process, and therefore its explanation is omitted here.

By the processes from the steps S2 to S5, the duty ratio of the positive and negative transmission pulses INd_P and INd_N becomes an optimum value that is determined in the design. Subsequent to the above-described duty ratio correction process, the power amplifier unit 43 according to the first embodiment performs a phase difference correction process. In the example shown in FIG. 14, the power amplifier unit 43 performs a first phase difference correction process (steps S6 and S7) and a second phase difference correction process (steps S8 and S9) as the phase difference correction process. However, in some embodiments, only one of the first and second phase difference correction processes may be performed. However, it is possible to obtain an advantageous effect that the resolution can be improved by performing both of the first and second phase difference correction processes.

In the step S6, the phase difference setting circuit 55 turns on the switches SWPHN and SWPHBN and turns off the other switches. As a result, in the phase difference setting circuit 55, a DC voltage signal LPFO_N having a voltage level that is determined according to the duty ratio of the phase difference detection signal output from the phase difference detector 61 is input to the inverting input terminal of the comparator 64 and the phase difference reference voltage VREF_PH is input to the non-inverting input terminal of the comparator 64. In the step S7, the phase difference setting circuit 55 performs a process for correcting the phase difference between the positive and negative transmission pulses INd_P and INd_N, which reach the power amplifier 54 through the phase difference adjustment circuits 52p and 52n, while changing, among the phase control values indicated by the phase control signal PH_CONT, the positive-side phase control value supplied to the phase difference adjustment circuit 52p in accordance with a predetermined sequence.

Figure 16:
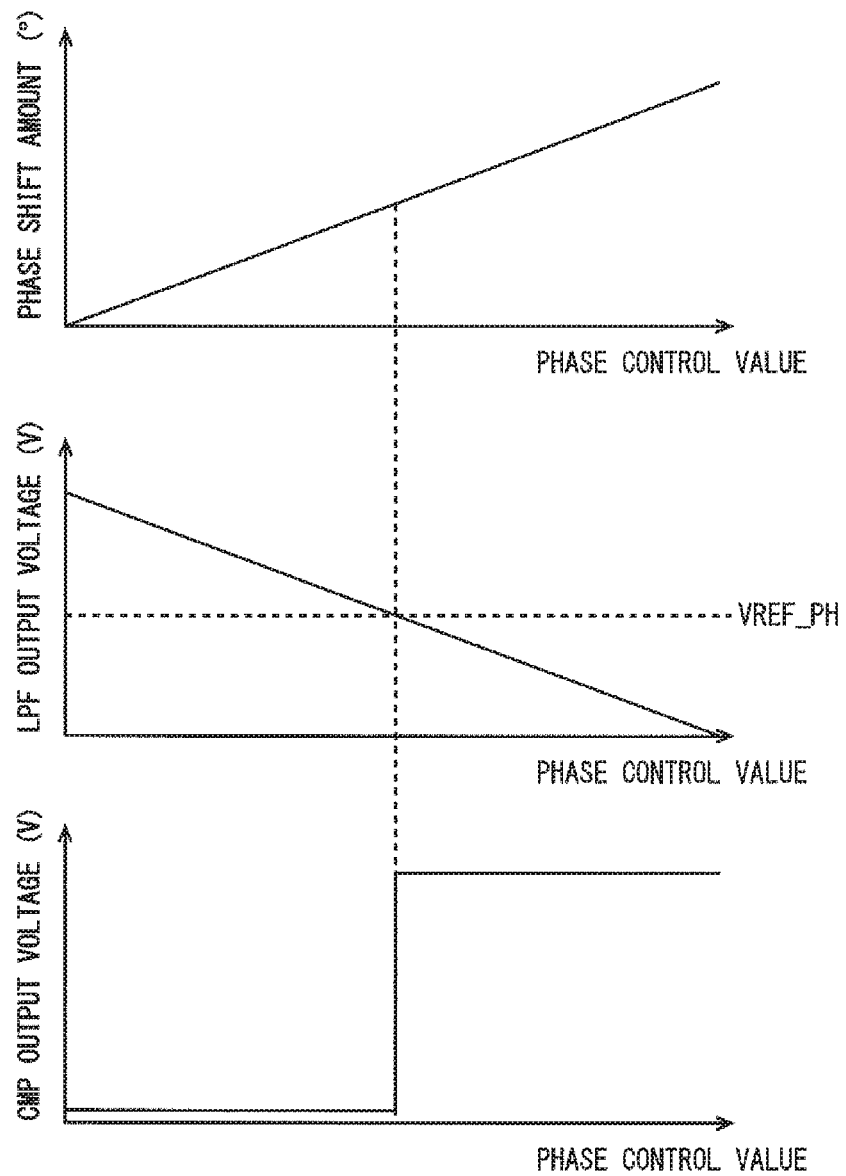
FIG. 16 is a graph for explaining a control characteristic of a first phase correction in the power amplifier unit according to the first embodiment.

A method for changing the phase control value in the first phase correction process is explained hereinafter. FIG. 16 shows a graph for explaining a control characteristic of a first phase correction in the power amplifier unit according to the first embodiment. In the first phase correction process, when the phase control value is increased, an amount of delay of the positive transmission pulses INd_P is increased. Further, the phase difference between the positive and negative transmission pulses INd_P and INd_N decreases in proportion to the increase in the amount of delay of the positive transmission pulses INd_P. Therefore, the voltage value of the DC voltage signal LPFO_N output from the low-pass filter 62 decreases as the phase control value rises. A measurement result signal output by the comparator 64 becomes a low level when the DC voltage signal LPFO_N is higher than the phase difference reference voltage VREF_PH and becomes a high level when the DC voltage signal LPFO_N is lower than the phase difference reference voltage VREF_PH. The phase difference setting circuit 55 observes the measurement result signal output from the comparator 64 while changing the phase control value based on a binary search or changing the phase control value by sweeping it, and thereby determines the phase control value by which the phase difference between the positive and negative transmission pulses INd_P and INd_N becomes a phase difference corresponding to the phase difference reference voltage VREF_PH.

In the step S8, the phase difference setting circuit 55 turns on the switches SWPHP and SWPHBP and turns off the other switches. As a result, in the phase difference setting circuit 55, a DC voltage signal LPFO_P having a voltage level that is determined according to the duty ratio of the phase difference detection signal output from the phase difference detector 61 is input to the non-inverting input terminal of the comparator 64 and the phase difference reference voltage VREF_PH is input to the inverting input terminal of the comparator 64. In the step S9, the phase difference setting circuit 55 performs a process for correcting the phase difference between the positive and negative transmission pulses INd_P and INd_N, which reach the power amplifier 54 through the phase difference adjustment circuits 52p and 52n, while changing, among the phase control values indicated by the phase control signal PH_CONT, the negative-side phase control value supplied to the phase difference adjustment circuit 52n in accordance with a predetermined sequence.

Figure 17:
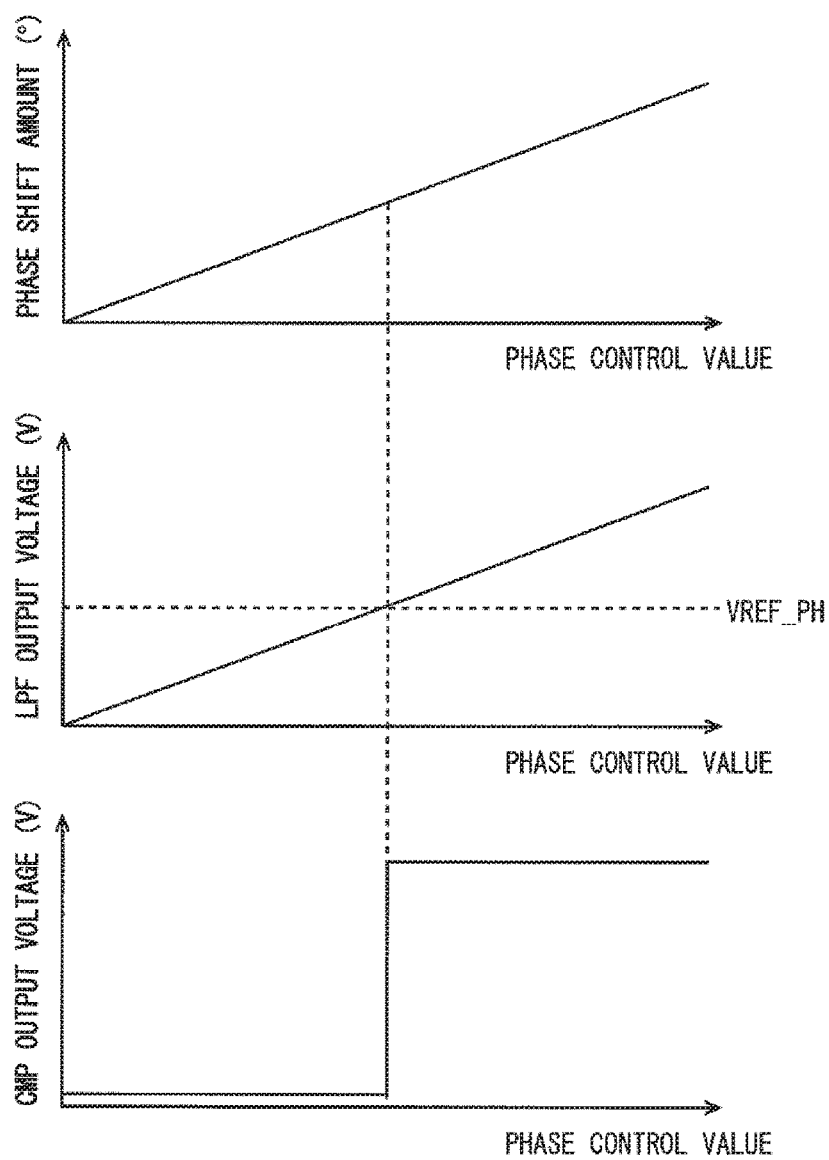
FIG. 17 is a graph for explaining a control characteristic of a second phase correction in the power amplifier unit according to the first embodiment.

A method for changing the phase control value in the second phase correction process is explained hereinafter. FIG. 17 shows a graph for explaining a control characteristic of a second phase correction in the power amplifier unit according to the first embodiment. In the second phase correction process, when the phase control value is increased, an amount of delay of the negative transmission pulses INd_N is increased. Further, the phase difference between the positive and negative transmission pulses INd_P and INd_N increases in proportion to the increase in the amount of delay of the negative transmission pulses INd_N. Therefore, the voltage value of the DC voltage signal LPFO_P output from the low-pass filter 62 rises as the phase control value rises. A measurement result signal output by the comparator 64 becomes a low level when the DC voltage signal LPFO_P is lower than the phase difference reference voltage VREF_PH and becomes a high level when the DC voltage signal LPFO_P is higher than the phase difference reference voltage VREF_PH. The phase difference setting circuit 55 observes the measurement result signal output from the comparator 64 while changing the phase control value based on a binary search or changing the phase control value by sweeping it, and thereby determines the phase control value by which the phase difference between the positive and negative transmission pulses INd_P and INd_N becomes a phase difference corresponding to the phase difference reference voltage VREF_PH.

By performing the processes in the above-described steps S1 to S9, in the power amplifier unit 43 according to the first embodiment, the duty ratio of the positive and negative transmission pulses INd_P and INd_N supplied to the power amplifier 54 is adjusted to a predetermined value lower than 50% and the phase difference between the positive and negative transmission pulses INd_P and INd_N is brought close to 180°.

As explained above, in the radio apparatus 1 according to the first embodiment, the duty ratio and the phase difference of two transmission pulse signals supplied to the power amplifier 54 can be adjusted in the power amplifier unit 43. Further, by bringing the phase difference between the two transmission pulse signals supplied to the power amplifier 54 close to 180°, the radio apparatus 1 according to the first embodiment can suppress the second-order harmonic distortion that occurs in the power amplifier 54.

Further, in the radio apparatus 1 according to the first embodiment, by adjusting the duty ratio of the two transmission pulse signals supplied to the power amplifier 54 to a value lower than 50% and thereby suppressing the maximum amplitude of the transmission signal RF_OUT, it is possible to form the power amplifier 54 by using transistors having low withstand voltages.

Further, in the radio apparatus 1 according to the first embodiment, since only the second-order distortion of the transmission signal RF_OUT can be suppressed, the matching circuit 13 can be formed by a simple circuit, thus making it possible to reduce the area in which peripheral components related to the radio apparatus 1 are mounted. Further, in the radio apparatus 1 according to the first embodiment, since the transmission output power, which is lowered by a filter characteristic of the matching circuit 13 or the like, can be reduced, the power amplifier unit 43 can be operated by lower power. That is, the power consumption of the radio apparatus 1 can be reduced by using the power amplifier unit 43 according to the first embodiment.

Further, in the power amplifier unit 43 according to the first embodiment, the duty control value and the phase control value, which are used to correct the duty ratio and the phase difference of the positive and negative transmission pulses INd_P and INd_N supplied to the power amplifier 54, are determined by using the positive and negative transmission pulses INd_P and INd_N. In this way, in the power amplifier unit 43 according to the first embodiment, it is possible to absorb a deviation of the duty ratio and a deviation of the phase difference that are caused due to variations among components of the duty ratio adjustment circuit 51, the phase difference adjustment circuit 52, and the pre-buffer 53 by the duty control value and the phase control value. That is, in the power amplifier unit 43 according to the first embodiment, the effect caused by variations among components of the duty ratio adjustment circuit 51, the phase difference adjustment circuit 52, and the pre-buffer 53 can be cancelled out by the duty control value and the phase control value.

Second Embodiment

In a second embodiment, a power amplifier unit 43a, which is another embodiment of the power amplifier unit 43 according to the first embodiment, is explained. In the explanation of the second embodiment, the same symbols as those in the first embodiment are assigned to the same components as those in the first embodiment and their explanations are omitted.

Figure 18:
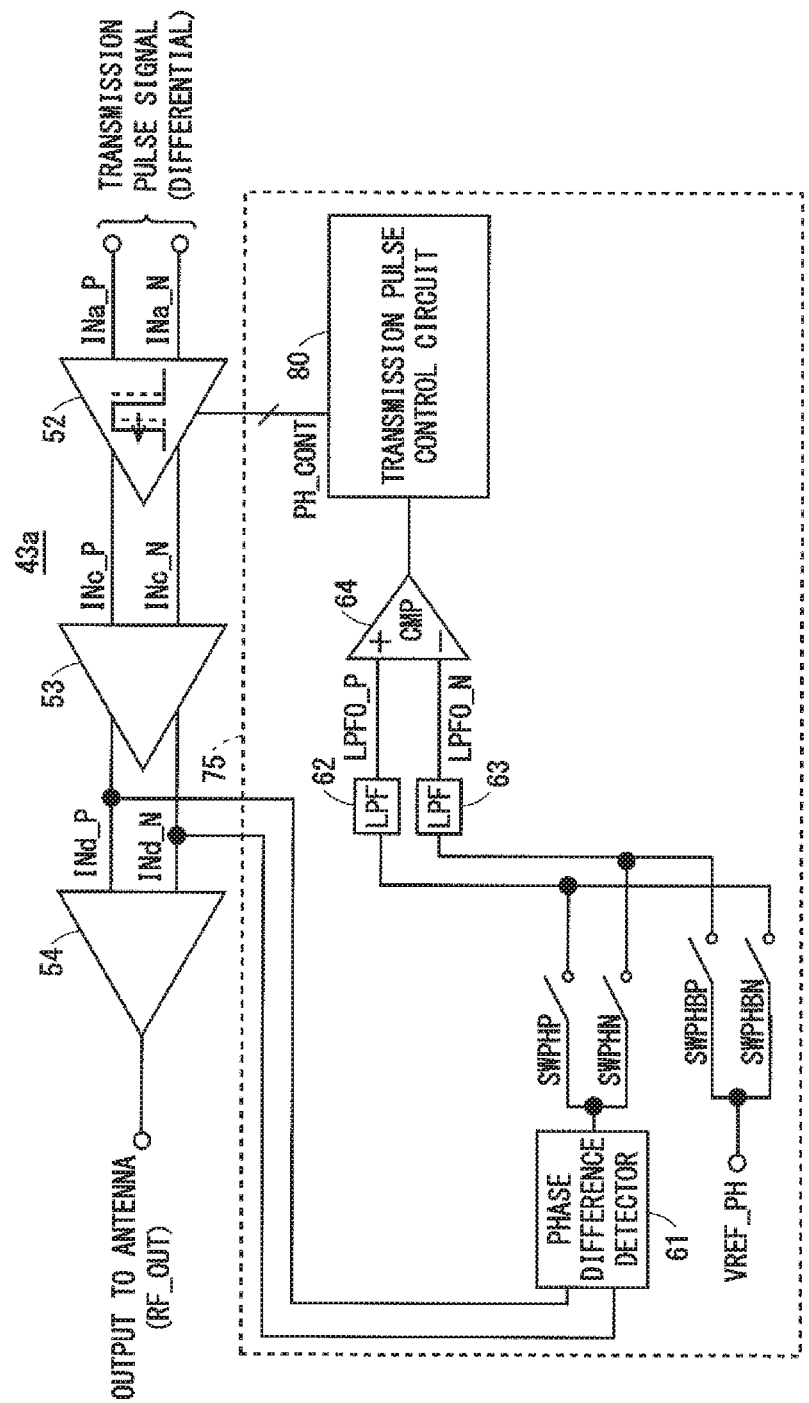
FIG. 18 is a block diagram of a power amplifier unit of a semiconductor device according to a second embodiment.

FIG. 18 shows a block diagram of a power amplifier unit 43a of a semiconductor device according to the second embodiment. As shown in FIG. 18, the power amplifier unit 43a according to the second embodiment is obtained by removing the duty ratio adjustment circuit 51, and replacing the phase difference setting circuit 55 and transmission pulse control circuit 60 with a phase difference setting circuit 75 and a transmission pulse control circuit 80, respectively, in the power amplifier unit 43 according to the first embodiment. The phase difference setting circuit 75 is obtained by removing the switches SWDTP, SWDTN and SWDTB from the phase difference setting circuit 55 according to the first embodiment. Further, the transmission pulse control circuit 80 is obtained by removing the function of outputting the duty control signal DT_CONT from the transmission pulse control circuit 60 according to the first embodiment.

That is, in a radio apparatus according to the second embodiment, the duty ratios of the positive and negative transmission pulses INa_P and INa_N supplied to the power amplifier unit 43a are already optimized so that they have the same values, and hence there is no need to adjust the duty of the transmission pulses in the power amplifier unit 43a. Note that it is also assumed that the duty ratio of the two transmission pulse signals input to the power amplifier 54 of the power amplifier unit 43a is lower than 50% in the radio apparatus according to the second embodiment.

Figure 19:
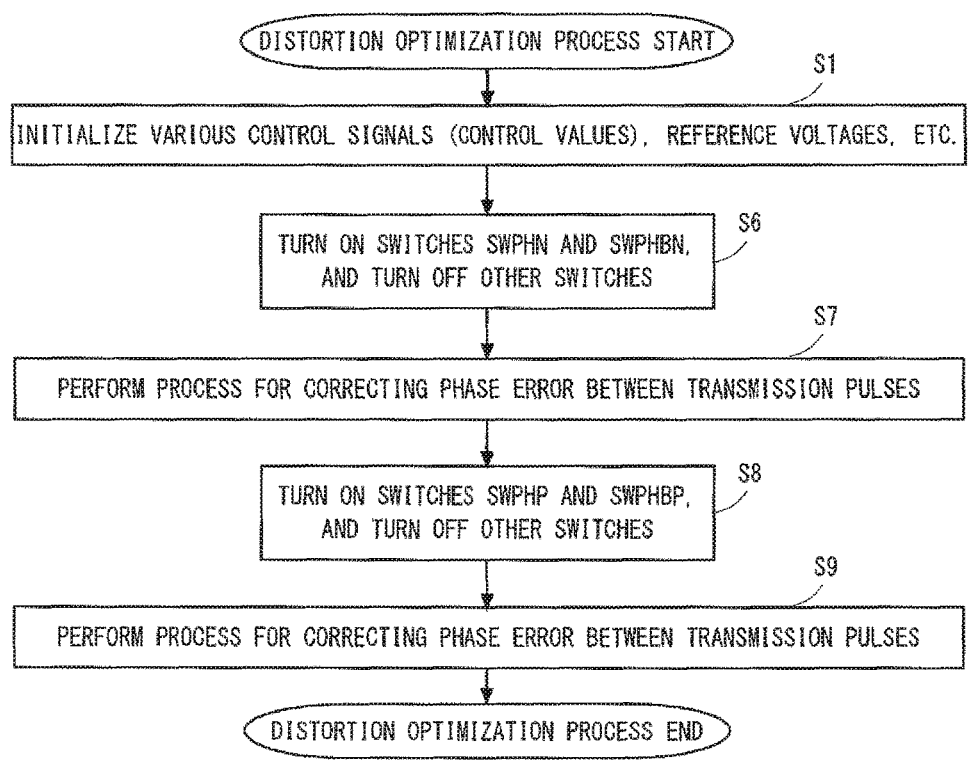
FIG. 19 is a flowchart for explaining a flow of a distortion optimization process in the power amplifier unit according to the second embodiment.

A distortion optimization process in the power amplifier unit 43a is explained. Accordingly, FIG. 19 shows a flowchart for explaining a flow of a distortion optimization process in the power amplifier unit according to the second embodiment. As shown in FIG. 19, the distortion optimization process in the power amplifier unit 43a according to the second embodiment is the same as the distortion optimization process according to the first embodiment explained with reference to FIG. 14 except that the duty ratio correction process in the steps S2 to S4 are omitted.

For example, as explained above with reference to FIGS. 12 and 13, when all that has to be done is to suppress the second-order distortion of the transmission signal RF_OUT, the duty ratio does not necessarily have to be adjusted to 50%. Therefore, even when the duty ratio is not adjusted in the power amplifier unit 43a as in the case of the radio apparatus according to the second embodiment, it is possible to improve the second-order distortion characteristic of the transmission signal RF_OUT by adjusting the phase difference between the two transmission pulse signals input to the power amplifier 54 to 180° by using the phase difference adjustment circuit 52.

By omitting the duty ratio correction process and the duty ratio adjustment process as described above, it is possible to reduce the circuit size and the processing time.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

The first and second embodiments can be combined as desirable by one of ordinary skill in the art.

What is claimed is:

1. A semiconductor device comprising:
   a phase difference adjustment circuit configured to receive first transmission pulses having a duty ratio lower than 50% and second transmission pulses having a duty ratio lower than 50% and correct an amount of phase difference of the second transmission pulses relative to the first transmission pulses, the second transmission pulses having a phase delayed from a phase of the first transmission pulses;

a power amplifier configured to generate a transmission signal based on the first and second transmission pulses output from the phase difference adjustment circuit and drive an antenna by the transmission signal; and a phase difference setting circuit configured to generate a phase control value according to a phase difference between the first and second transmission pulses and control an amount of phase difference between the first and second transmission pulses by providing the phase control value to the phase difference adjustment circuit.

2. The semiconductor device according to claim 1, wherein the phase difference setting circuit determines the phase control value so that the phase difference between the first and second transmission pulses becomes 180 degrees.

3. The semiconductor device according to claim 1, wherein the phase difference setting circuit comprises:

a phase difference detector configured to output a rectangular wave having rising edges corresponding to rising edges of the first transmission pulses input to the power amplifier and falling edges corresponding to rising edges of the second transmission pulses input to the power amplifier as a phase difference detection signal;

a smoothing circuit configured to smooth the phase difference detection signal and output a DC (Direct-Current) voltage signal having a signal level corresponding to the duty ratio of the phase difference detection signal as a phase difference correspondence voltage;

a comparison circuit configured to output a measurement result signal whose logic level is determined according to a relation between magnitudes of a phase difference reference voltage and the phase difference correspondence voltage, the phase difference reference voltage having a predefined voltage value; and a transmission pulse control circuit configured to increase or decrease the phase control value according to the measurement result signal.

4. The semiconductor device according to claim 3, wherein the phase difference setting circuit comprises:

a first switch configured to select whether or not the phase difference detection signal is supplied to a non-inverting input terminal of the comparison circuit through the smoothing circuit;

a second switch configured to select whether or not the phase difference reference voltage is supplied to an inverting input terminal of the comparison circuit;

a third switch configured to select whether or not the phase difference detection signal is supplied to the inverting input terminal of the comparison circuit through the smoothing circuit; and a fourth switch configured to select whether or not the phase difference reference voltage is supplied to the non-inverting input terminal of the comparison circuit.

5. The semiconductor device according to claim 4, wherein the transmission pulse control circuit performs:

a first phase difference correction process in which the phase control value is increased or decreased by turning on a first switch group including the first and second switches and turning off a second switch group including the third and fourth switches; and a second phase difference correction process in which the phase control value is increased or decreased by turning off the first switch group and turning on the second switch group.

6. The semiconductor device according to claim 3, further comprising a duty ratio adjustment circuit configured to correct a duty ratio of the first and second transmission pulses according to a duty control value and supply the corrected first and second transmission pulses to the phase difference adjustment circuit, wherein the transmission pulse control circuit performs:

a first duty ratio correction process in which the duty ratio of the first transmission pulses is corrected to a predefined specific duty ratio by increasing or decreasing the duty control value according to a result of a comparison between a first smoothed voltage and a duty ratio reference voltage by the comparison circuit, the first smoothed voltage being obtained by smoothing the first transmission pulses by the smoothing circuit, the duty ratio reference voltage having a predefined voltage value; and a second duty ratio correction process in which the duty ratio of the second transmission pulses is corrected to a predefined specific duty ratio by increasing or decreasing the duty control value according to a result of a comparison between a second smoothed voltage and the duty ratio reference voltage by the comparison circuit, the second smoothed voltage being obtained by smoothing the second transmission pulses by the smoothing circuit.

7. The semiconductor device according to claim 6, wherein the duty ratio has a value lower than 50%.

8. The semiconductor device according to claim 1, wherein the power amplifier is a class E amplifier comprising a differential pair to which the first and second transmission pulses are input, and a resonant circuit driven by the differential pair.

9. The semiconductor device according to claim 8, wherein the resonant circuit comprises:

an inductor disposed between drains of two transistors constituting the differential pair;

a capacitor disposed in parallel with the inductor; and a balun comprising a primary coil disposed in parallel with the inductor.

* * * * *